United States Patent
Barth, Jr. et al.

(10) Patent No.: US 8,946,045 B2
(45) Date of Patent: Feb. 3, 2015

(54) METAL-INSULATOR-METAL (MIM) CAPACITOR WITH DEEP TRENCH (DT) STRUCTURE AND METHOD IN A SILICON-ON-INSULATOR (SOI)

(75) Inventors: John E. Barth, Jr., Williston, VT (US); Herbert L. Ho, New Windsor, NY (US); Babar A. Khan, Ossining, NY (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 13/457,601

(22) Filed: Apr. 27, 2012

(65) Prior Publication Data

US 2013/0285193 A1   Oct. 31, 2013

(51) Int. Cl.
*H01L 21/02* (2006.01)
*H01L 21/8242* (2006.01)
*H01L 29/02* (2006.01)

(52) U.S. Cl.
USPC .......... 438/389; 257/532; 257/301; 257/506; 438/391; 438/392; 438/242

(58) Field of Classification Search
USPC .......... 438/238, 386, 399, 243; 257/296, 299, 257/301
See application file for complete search history.

(56) References Cited

U.S. PATENT DOCUMENTS

| | | | |
|---|---|---|---|
| 6,255,731 B1 * | 7/2001 | Ohmi et al. | 257/758 |
| 6,524,926 B1 * | 2/2003 | Allman et al. | 438/387 |
| 6,703,273 B2 | 3/2004 | Wang et al. | |
| 7,388,244 B2 | 6/2008 | Ho et al. | |
| 7,575,970 B2 | 8/2009 | Ho et al. | |
| 7,682,896 B2 | 3/2010 | Ho et al. | |
| 7,732,274 B2 | 6/2010 | Zhu et al. | |
| 7,741,188 B2 * | 6/2010 | Dyer et al. | 438/386 |
| 7,750,388 B2 | 7/2010 | Ho et al. | |
| 7,791,123 B2 | 9/2010 | Cannon et al. | |
| 7,799,675 B2 * | 9/2010 | Lee | 438/637 |
| 7,808,028 B2 | 10/2010 | Cheng | |
| 7,888,723 B2 | 2/2011 | Brodsky et al. | |
| 7,910,451 B2 * | 3/2011 | Dyer | 438/386 |
| 7,951,666 B2 | 5/2011 | Ho et al. | |
| 8,093,641 B2 * | 1/2012 | Weis | 257/306 |
| 2002/0153590 A1 * | 10/2002 | Kunikiyo | 257/532 |
| 2005/0196932 A1 * | 9/2005 | Divakaruni et al. | 438/389 |
| 2006/0118907 A1 * | 6/2006 | Park | 257/532 |
| 2012/0049256 A1 * | 3/2012 | Lim et al. | 257/296 |
| 2013/0032868 A1 * | 2/2013 | Pei et al. | 257/301 |

OTHER PUBLICATIONS

U.S. Appl. No. 13/428,004, filed Mar. 23, 2012.

\* cited by examiner

*Primary Examiner* — Steven Loke
*Assistant Examiner* — David Goodwin
(74) *Attorney, Agent, or Firm* — Gibb & Riley, LLC; Michael J. LeStrange, Esq.

(57) ABSTRACT

A structure forming a metal-insulator-metal (MIM) trench capacitor is disclosed. The structure comprises a multi-layer substrate having a metal layer and at least one dielectric layer. A trench is etched into the substrate, passing through the metal layer. The trench is lined with a metal material that is in contact with the metal layer, which comprises a first node of a capacitor. A dielectric material lines the metal material in the trench. The trench is filled with a conductor. The dielectric material that lines the metal material separates the conductor from the metal layer and the metal material lining the trench. The conductor comprises a second node of the capacitor.

14 Claims, 30 Drawing Sheets

METAL-INSULATOR-METAL (MIM) CAPACITOR WITH DEEP TRENCH (DT) STRUCTURE AND METHOD IN A SILICON-ON-INSULATOR (SOI)

BACKGROUND

The present disclosure relates to capacitors, and, more particularly, to a metal-insulator-metal capacitor with deep trench structure and method of forming the structure with silicon-on-insulator technology.

Trench capacitors are widely used in various semiconductor applications. For example, embedded dynamic random access memory (DRAM) technology, in which trench capacitors can be used, has played an important role in the emerging system-on-chip (SoC) products. Significant system performance gains have been demonstrated by integrating the embedded DRAM and logic units on the same chip. Given the enormous success of embedded DRAM technology achieved on bulk silicon substrates, integrating embedded DRAM with silicon-on-insulator (SOI) technology will further boost the performance of high-end SOI server chips. Substrate resistance, however, can limit both DRAM and deep trench capacitance behavior.

A typical deep trench capacitor comprises a deep trench in a semiconductor substrate (e.g., the semiconductor substrate of either a bulk silicon wafer or silicon-on-insulator (SOI) wafer). Typically, a doped region within the substrate adjacent to the trench forms one capacitor plate (i.e., a buried capacitor plate). A dielectric layer lining the trench forms the capacitor dielectric. Finally, a conductive fill material (e.g., a doped polysilicon) within the trench forms another capacitor plate. A standard contact can be formed to the capacitor plate within the trench. However, a number of additional processing steps are required to form the buried capacitor plate contact.

For example, if a bulk silicon wafer is used, then the deep trench capacitor must be formed such that it extends through an N-doped diffusion connector (e.g., an NWELL) in the silicon substrate. Next, a feature is patterned in the NWELL at the top surface of the silicon substrate and a contact is formed to this patterned silicon feature. Similarly, if a silicon-on-insulator (SOI) wafer is used, then the deep trench capacitor must be formed such that it extends through an N-doped diffusion connector (e.g., an NBAND) below the buried oxide (BOX) layer. Next, a patterned doped polysilicon feature is formed that extends through the BOX layer to the NBAND and a contact is formed to this polysilicon feature.

In either case, due to the requirement of an N-doped diffusion connector, circuit design flexibility is sacrificed. Furthermore, in either case photolithographic techniques must be used to pattern a feature to the N-doped diffusion connector. Consequently, the ground rules for these additional processing steps must take into account overlay tolerances between the contact structures and the deep trench capacitor itself, critical dimension tolerances, the minimum allowable distance between the buried trench and the boundary of the n-doped diffusion connector, etc. Consequently, process windows are small and the sizes of the various circuits that incorporate such deep trench capacitors (e.g., SRAM cells) are not optimized.

SUMMARY

According to one embodiment herein, a structure forming a metal-insulator-metal (MIM) trench capacitor is disclosed. The structure comprises a multi-layer substrate having a metal layer and at least one dielectric layer. A trench is etched into the substrate, passing through the metal layer. The trench is lined with a metal material that is in contact with the metal layer, which comprises a first node of a capacitor. A dielectric material lines the metal material in the trench. The trench is filled with a conductor. The dielectric material that lines the metal material separates the conductor from the metal layer and the metal material lining the trench. The conductor comprises a second node of the capacitor.

According to another embodiment herein, a semiconductor structure is disclosed. The structure comprises a wafer comprising an insulator layer, a metal layer below the insulator layer, and a substrate below the metal layer. A trench in the wafer extends through the insulator layer, through the metal layer, and at least partially into the substrate. A metal sidewall lines the trench such that the metal sidewall is in contact with the metal layer. The metal layer comprises a first node of a capacitor. A dielectric material lines the metal sidewall. A conductive fill material fills the trench such that the conductive fill material is not in contact with the metal layer. The conductive fill material comprises a second node of the capacitor.

According to another embodiment herein, a method of forming a capacitor structure is disclosed. The method comprises forming a multi-layer semiconductor substrate comprising a metal layer and at least one other layer. A trench is formed in the multi-layer substrate. A metal sidewall is formed within the trench such that the metal sidewall is in contact with the metal layer. The metal layer is a first node of the capacitor structure. The metal sidewall is lined with a dielectric material. The trench is filled with a conductive fill material such that the conductive fill material in the trench is not in contact with the metal layer. The conductive fill material is a second node of the capacitor structure.

BRIEF DESCRIPTION OF THE DRAWINGS

The embodiments herein will be better understood from the following detailed description with reference to the drawings, which are not necessarily drawing to scale and in which.

DETAILED DESCRIPTION

Figure 1:
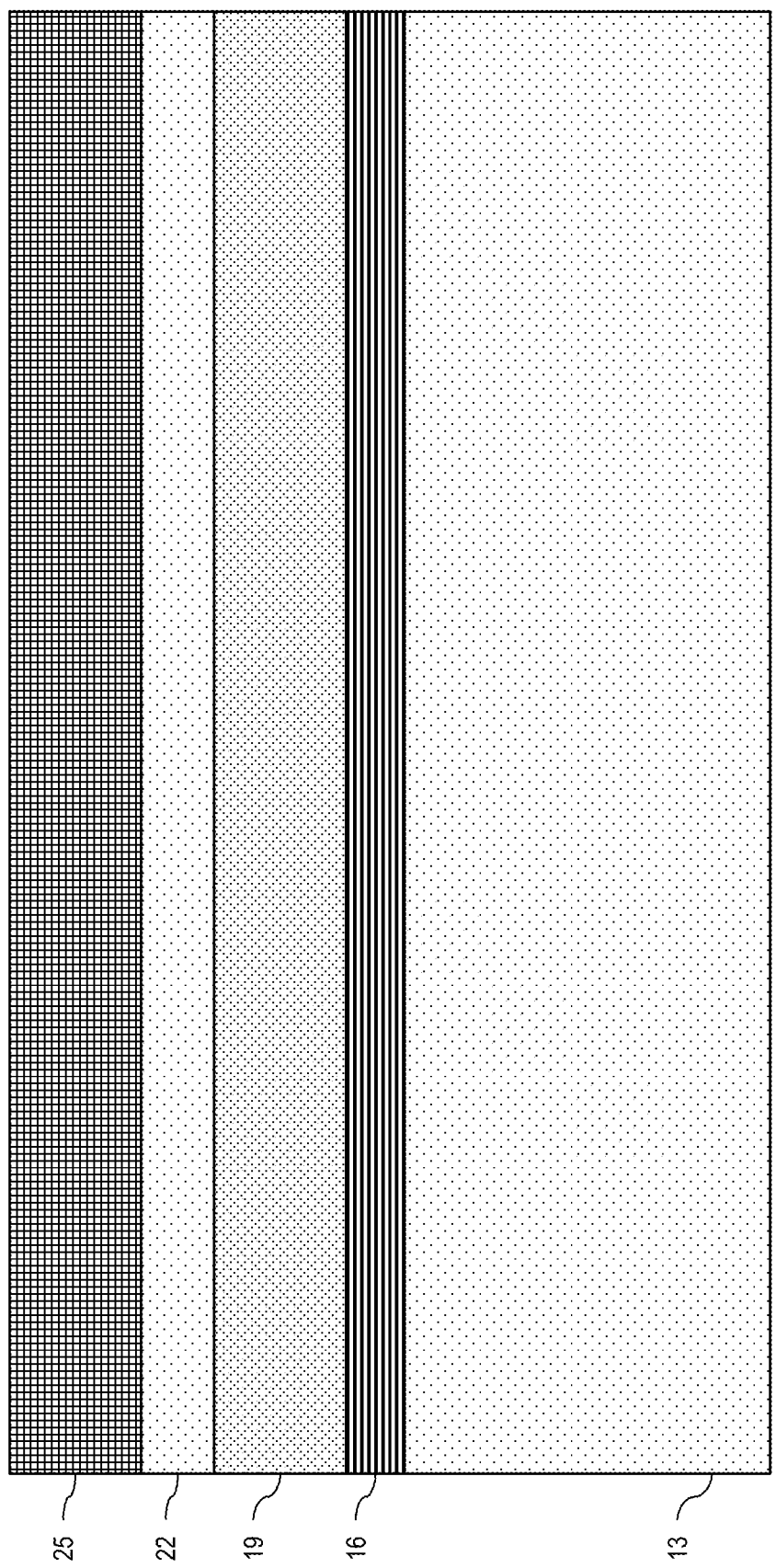
FIGS. 1-9 are schematic diagrams of a sectional view of semiconductor structure fabricating a capacitor according to embodiments herein.

Referring now to the drawings, and more particularly to FIGS. 1-9, there are shown exemplary illustrations of the method and structures of a capacitor embedded in a deep trench in a semiconductor.

For purposes herein, a "semiconductor" is a material or structure that may include an implanted impurity that allows the material to sometimes be a conductor and sometimes be an insulator, based on electron and hole carrier concentration.

As used herein, "implantation processes" can take any appropriate form (whether now known or developed in the future) and can comprise, for example, ion implantation, etc.

FIG. 1 illustrates a schematic diagram of a sectional view of a multi-layer substrate 10 for fabricating a metal-insulator-metal capacitor with deep trench structure.

The multi-layer substrate 10 includes a silicon base layer 13, a metal layer 16 (which may comprise a silicide), a dielectric (or insulator) layer 19, and an SOI layer 22. A sacrificial layer 25, such as an oxide layer, may cover the SOI layer 22.

For purposes herein, an "insulator" is a relative term that means a material or structure that allows substantially less (<95%) electrical current to flow than does a "conductor." The dielectrics (insulators) mentioned herein can, for example, be formed by plasma deposition of SiO2 or SiO2 based materials by reacting either tetra-ethyl-ortho-silane (TEOS) or silane with O2 or activated O2, i.e. O3 or O—. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, nickel, aluminum, or copper, or a metal silicide, any alloys of such metals, and may be deposited using physical vapor deposition, chemical vapor deposition, or any other technique known in the art.

Figure 2:
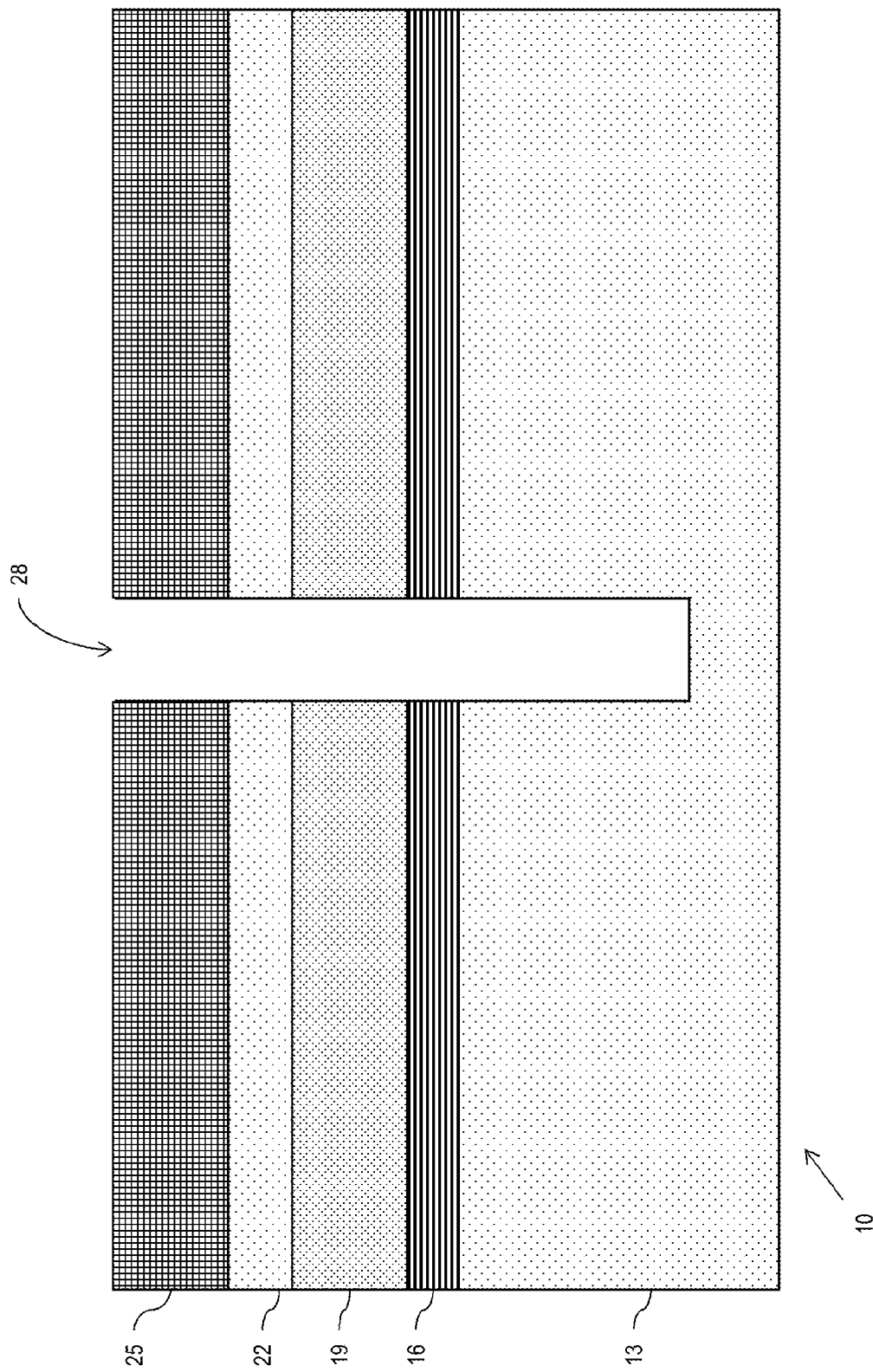

As shown in FIG. 2, a deep trench 28 is formed in the multi-layer substrate 10. The trench 28 passes through the sacrificial layer 25, the SOI layer 22, the dielectric layer 19, the metal layer 16, and at least partially into the silicon base layer 13. The trench 28 can be formed by any appropriate means, such as by applying a pattern and etching the various layer materials.

Figure 3:
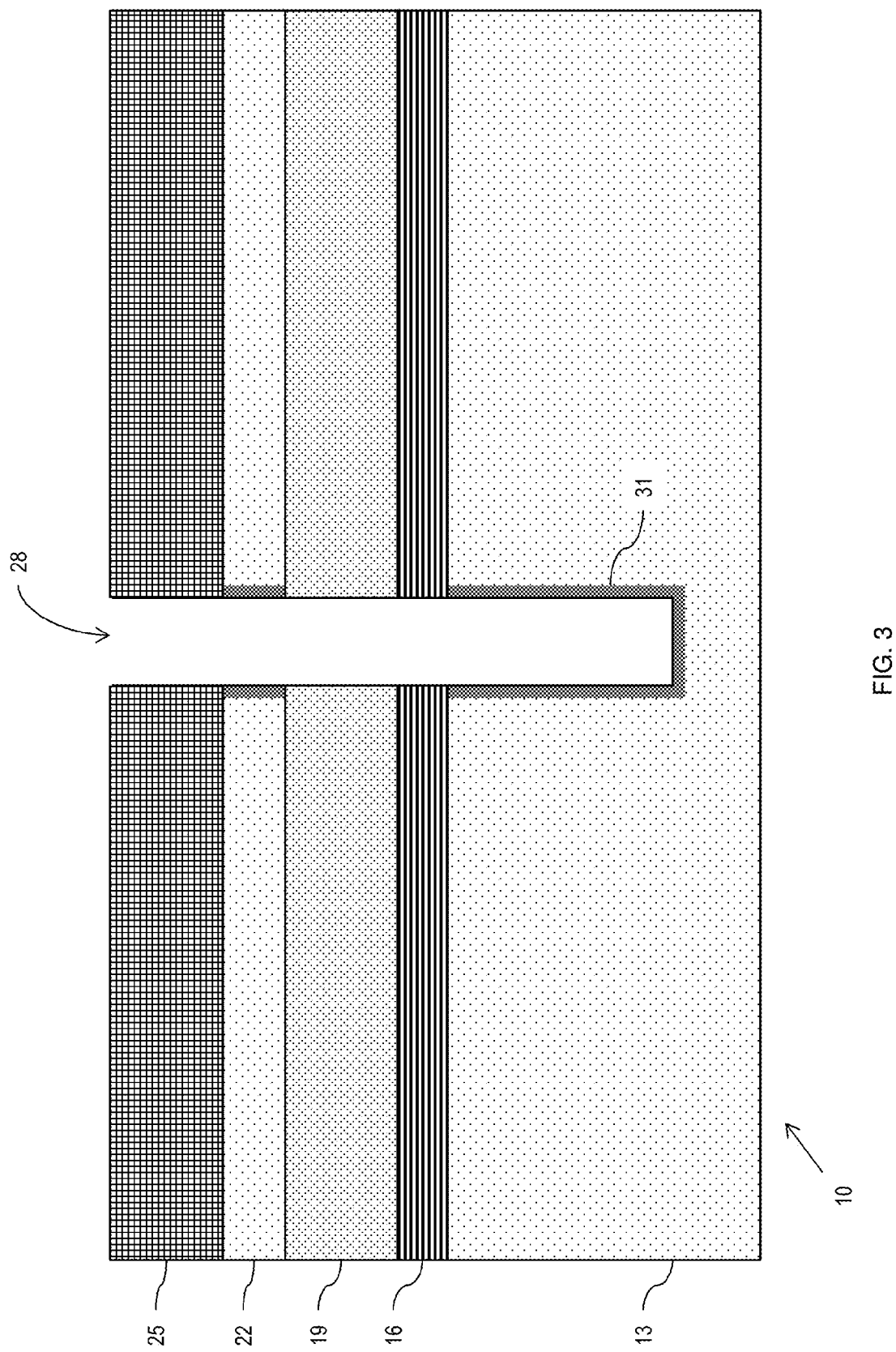

FIG. 3 shows a metal sidewall 31 formed in the trench 28. The metal sidewall 31 connects to the metal layer 16. In some embodiments, the metal sidewall 31 may connect only to the bottom surface of the metal layer 16. The metal sidewall 31 can be any appropriate conductive material, such as silicide and may be the same material or different material as the metal layer 16. The metal layer 16 forms a first node of a capacitor structure.

Figure 4:
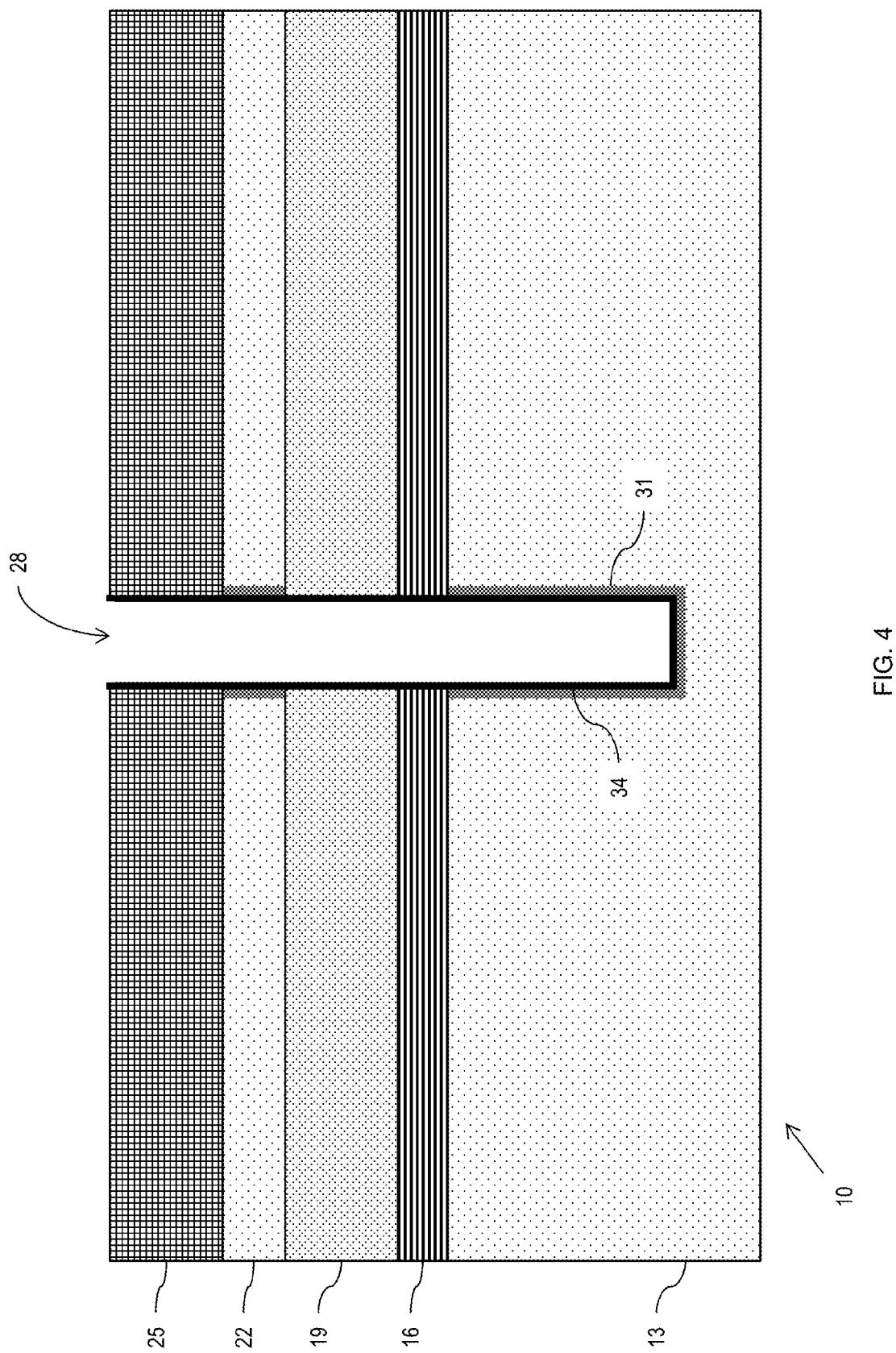

After the metal sidewall 31 is formed, a dielectric material 34 is deposited in the trench 28, as shown in FIG. 4.

Figure 5:
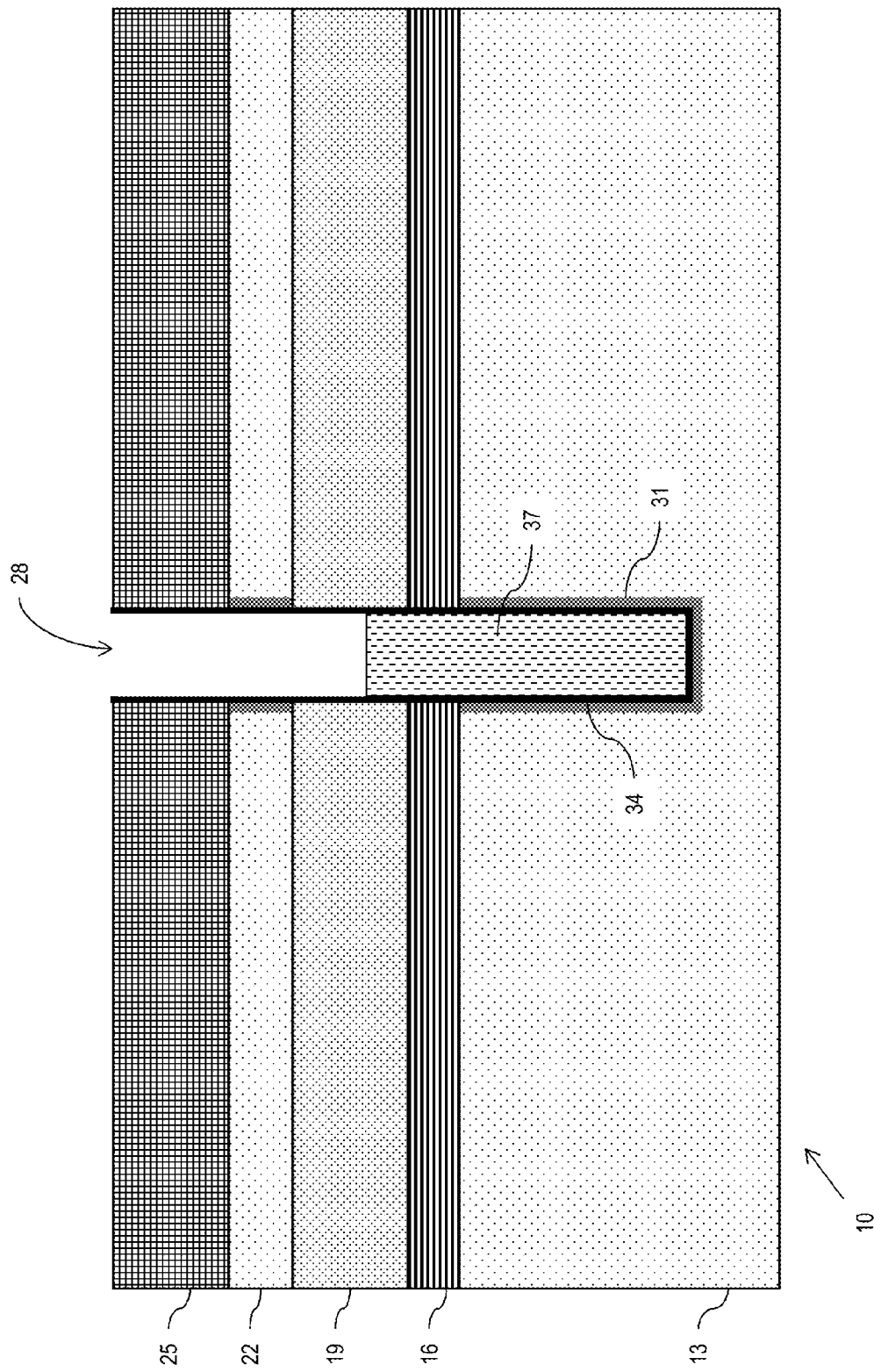

In FIG. 5, a conductor 37 is formed in the trench 28 by filling with a conductive fill material and recessing the conductor 37 to an appropriate height within the trench 28. In some embodiments, the conductor 37 can be connected to the SOI layer 22. The trench is filled with a conductive fill material such that the conductive fill material in the trench is not in contact with the metal layer 16. The dielectric material 34 separates the conductor 37 from the metal layer 16 and the metal sidewall 31 lining the trench 28. Recessing of the conductive fill material can be accomplished by any appropriate means known in the art. The conductive fill material may be the same material or different material as the metal layer 16 and the same as or different than the material used for the metal sidewall 31. The conductor 37 forms a second node of the capacitor structure.

Figure 6:
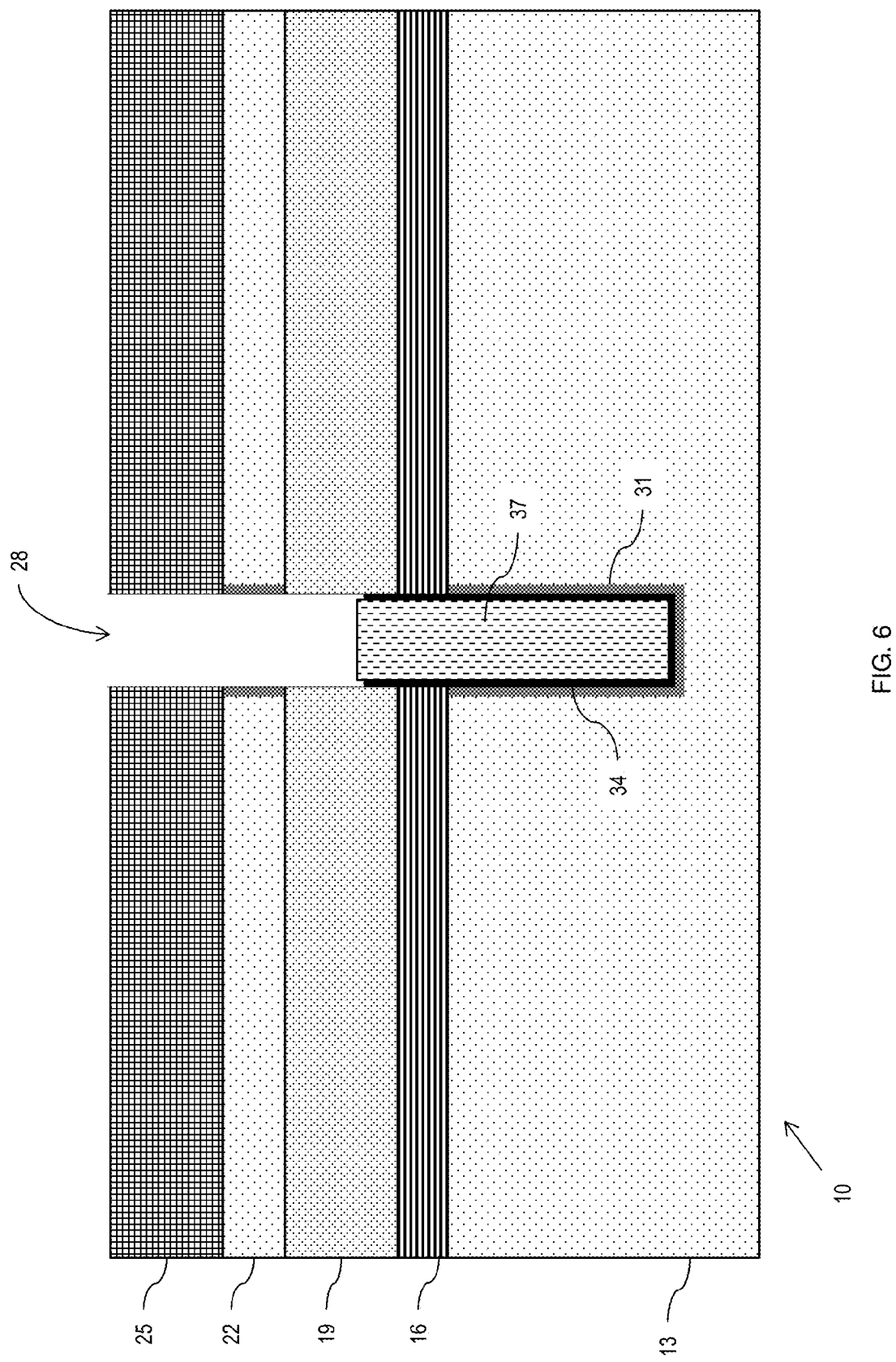
Figure 7:
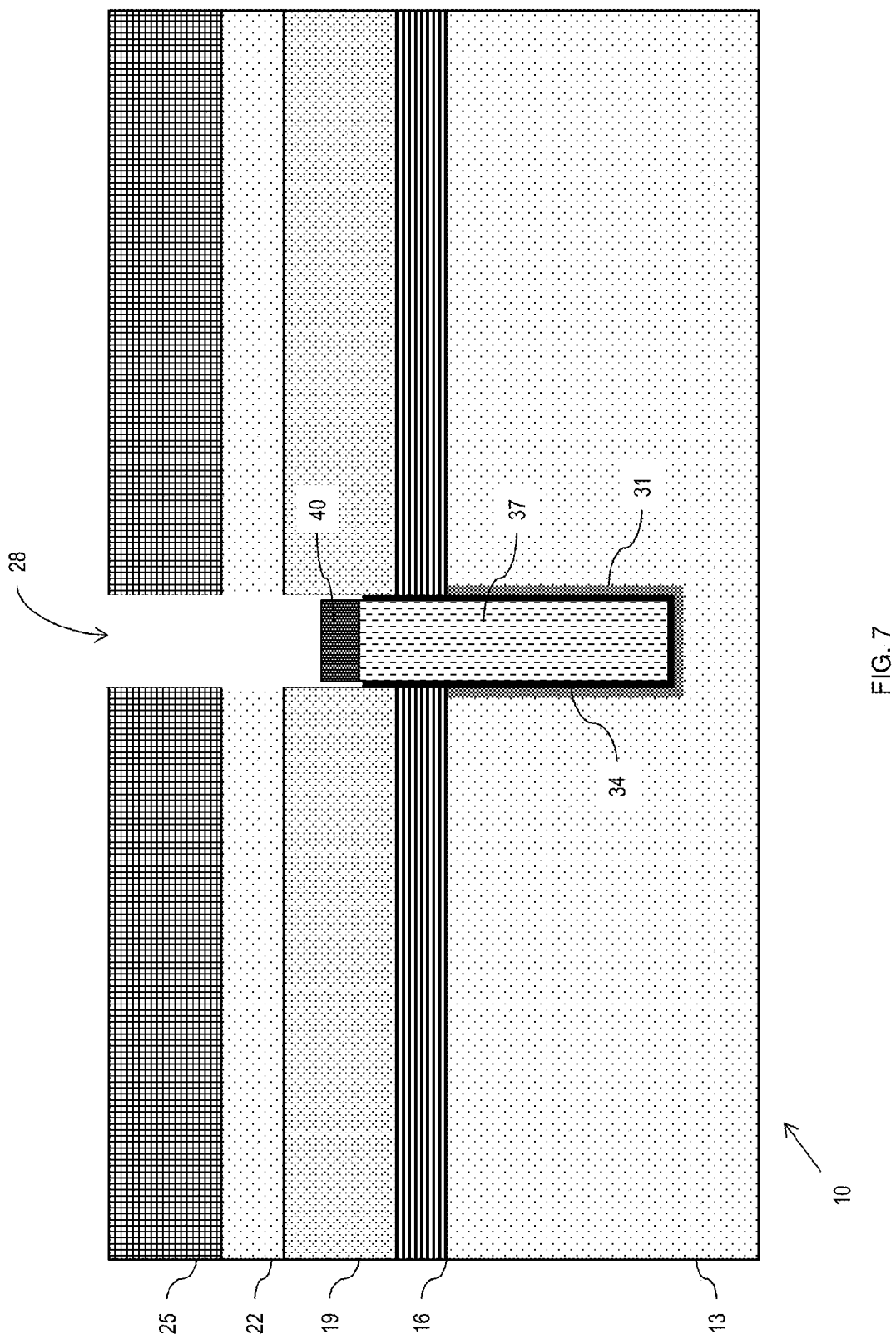
Figure 8:
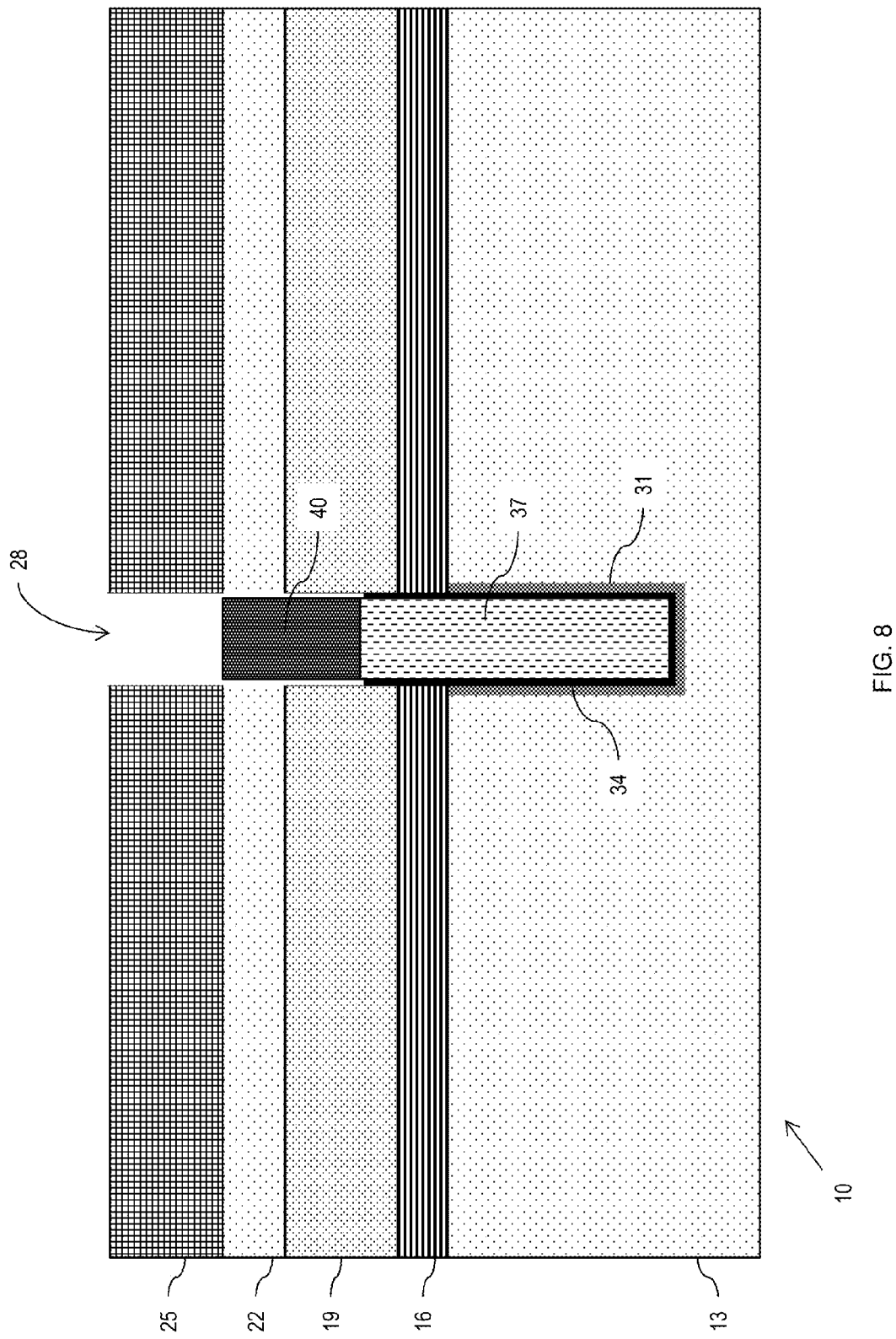

In FIG. 6, the dielectric material 34 is removed from the exposed areas of the trench 28. Then, as shown in FIG. 7, a poly cap 40 is deposited on the conductor 37. The poly cap 40 is recessed by any appropriate means known in the art to enable the metal sidewall to be removed from the SOI layer 22, if desired. Otherwise, the trench 28 is filled with poly and recessed to shorten the trench height to the SOI layer 22, as shown in FIG. 8.

Figure 9:
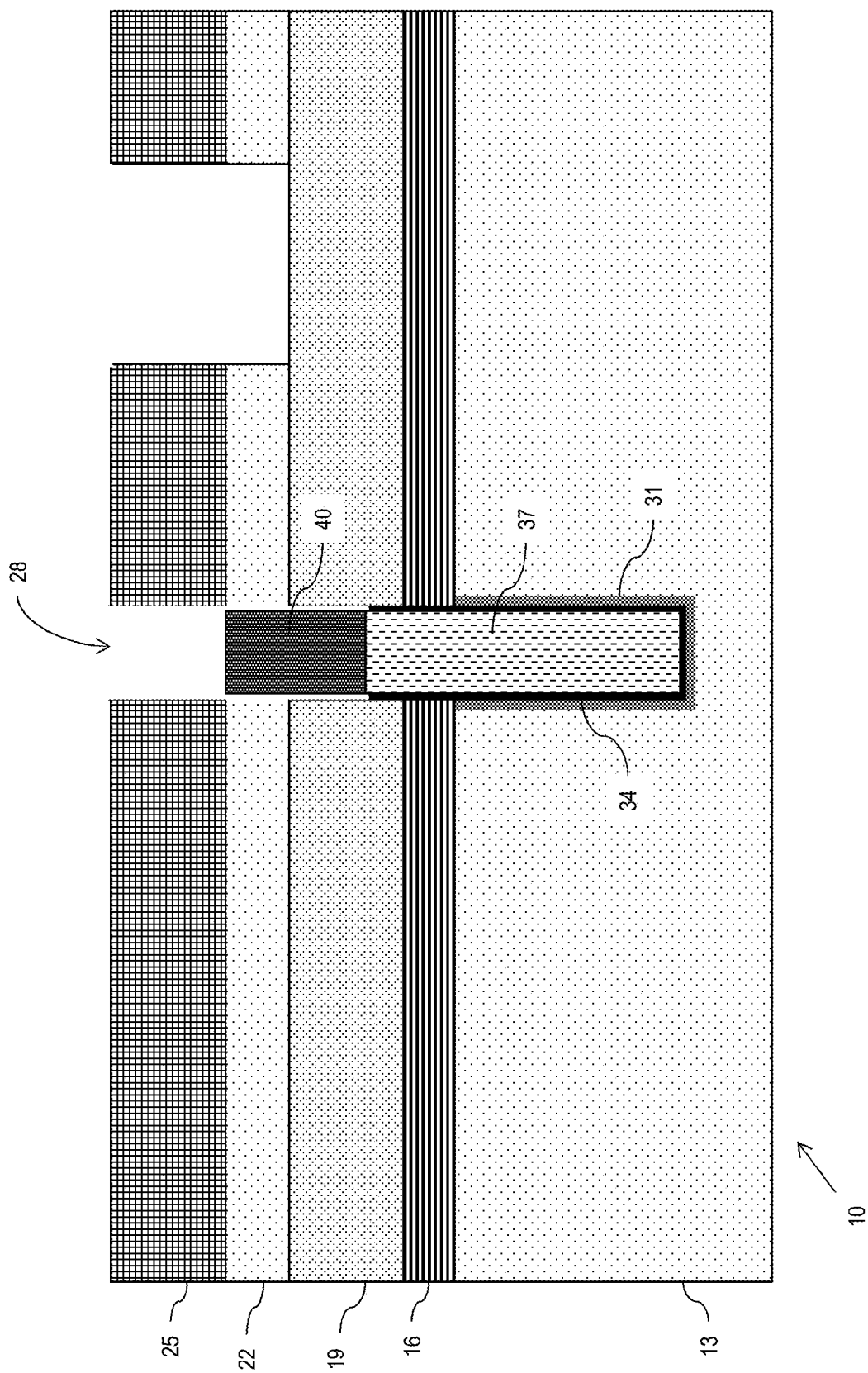

FIG. 9 shows, after forming the deep trench MIM capacitor, processing of the multi-layer substrate 10 can proceed to STI patterning and etching as is known in the art.

When patterning any material herein, the material to be patterned can be grown or deposited in any known manner and a patterning layer (such as an organic photoresist or hardmask) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

A hardmask can be formed of any suitable material, whether now known or developed in the future, such as a metal or organic or inorganic (Si3N4, SiC, SiO2C (diamond)) hardmask, that has a hardness greater than the substrate and insulator materials used in the remainder of the structure.

Figure 10:
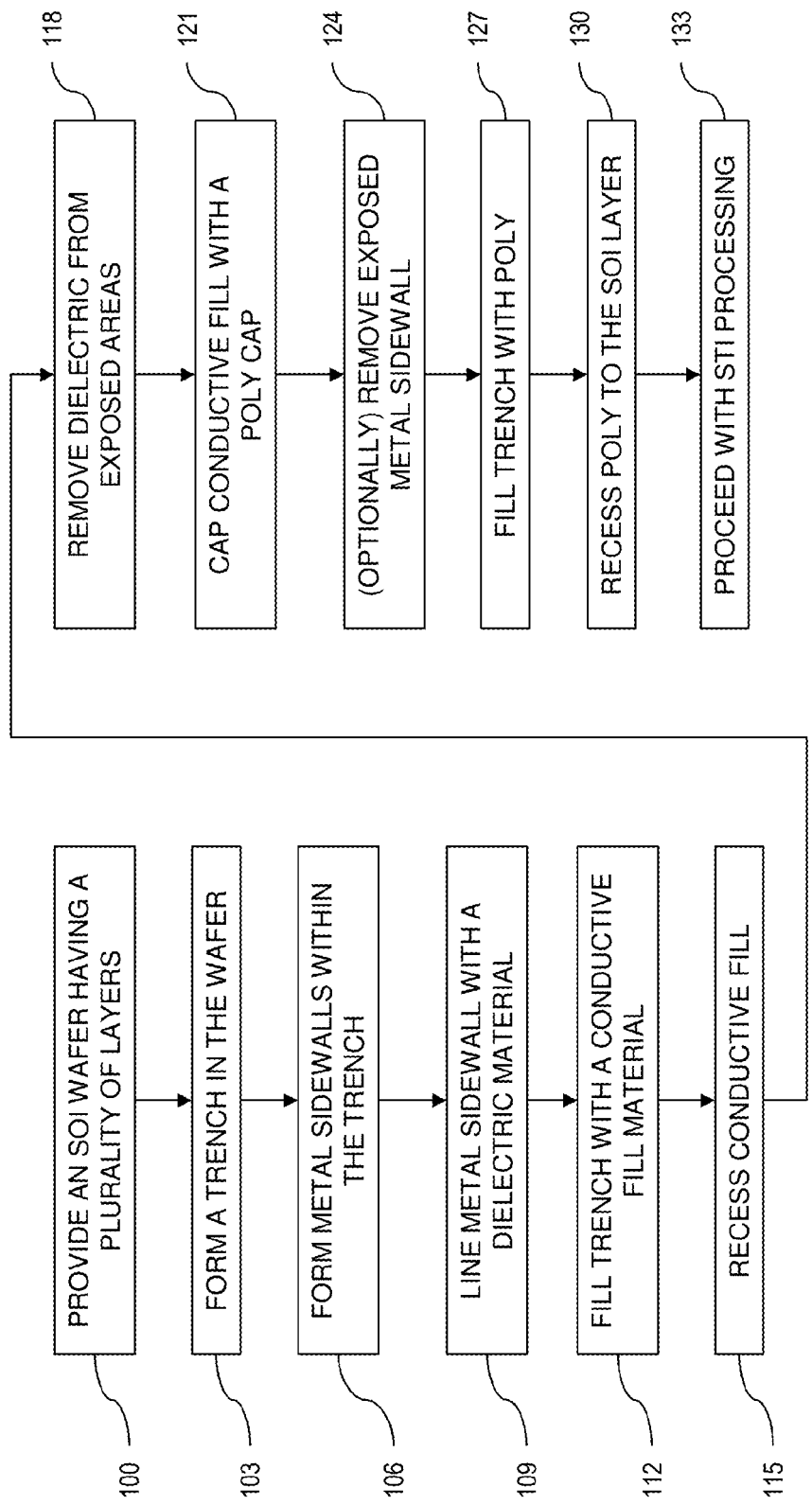
FIG. 10 is a flow diagram illustrating embodiments herein.

FIG. 10 shows a logic flowchart for an embodiment for a method of fabricating a capacitor in a semiconductor including providing an SOI wafer including a plurality of layers 100. A trench is formed in the wafer, at 103. At 106, sidewalls are formed within the trench such that the metal sidewall is in contact with the metal layer. The sidewalls may be a metal or silicide material. The metal sidewall is lined with a dielectric material, at 109. The trench is filled with a conductive fill material 112 such that the conductive fill material in the trench is not in contact with the metal layer and the conductive fill is recessed 115. At 118, the dielectric is removed from exposed areas. At 121, the conductive fill is capped with a poly cap. The exposed metal sidewall can be optionally removed, at 124. At 127, the trench is filled with poly and recessed to the SOI layer, at 130. At 133, STI processing can proceed with etching, as is known in the art.

Figure 11:
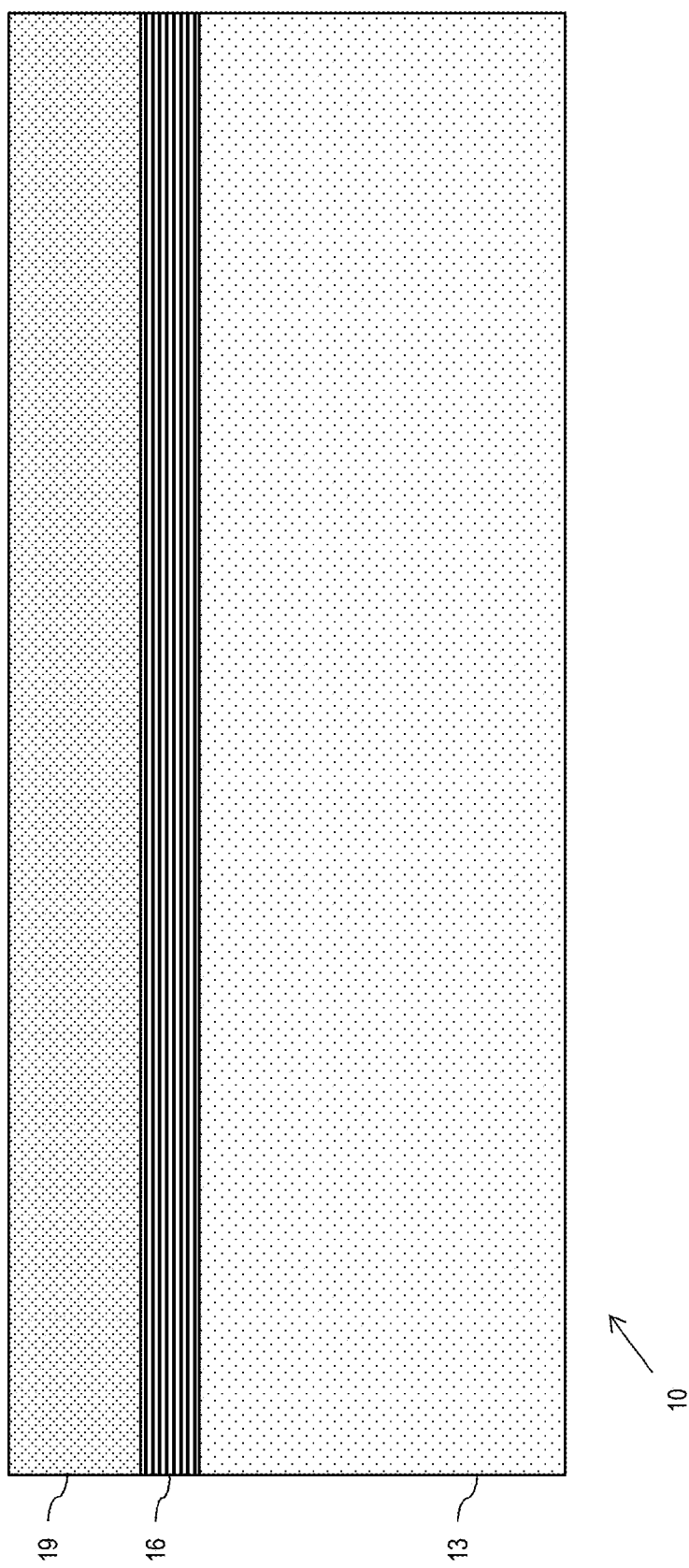
FIGS. 11-17 are schematic diagrams of a sectional view of semiconductor structure fabricating a capacitor according to embodiments herein.

In another embodiment, a silicon layer is bonded to an insulator layer after formation of the deep trench MIM capacitor. FIG. 11 illustrates a schematic diagram of a sectional view of a multi-layer substrate 10 for fabricating a metal-insulator-metal capacitor with deep trench structure according to this embodiment. The multi-layer substrate 10 includes a silicon base layer 13, a metal layer 16 (which may comprise a silicide), and a dielectric (or insulator) layer 19.

Figure 12:
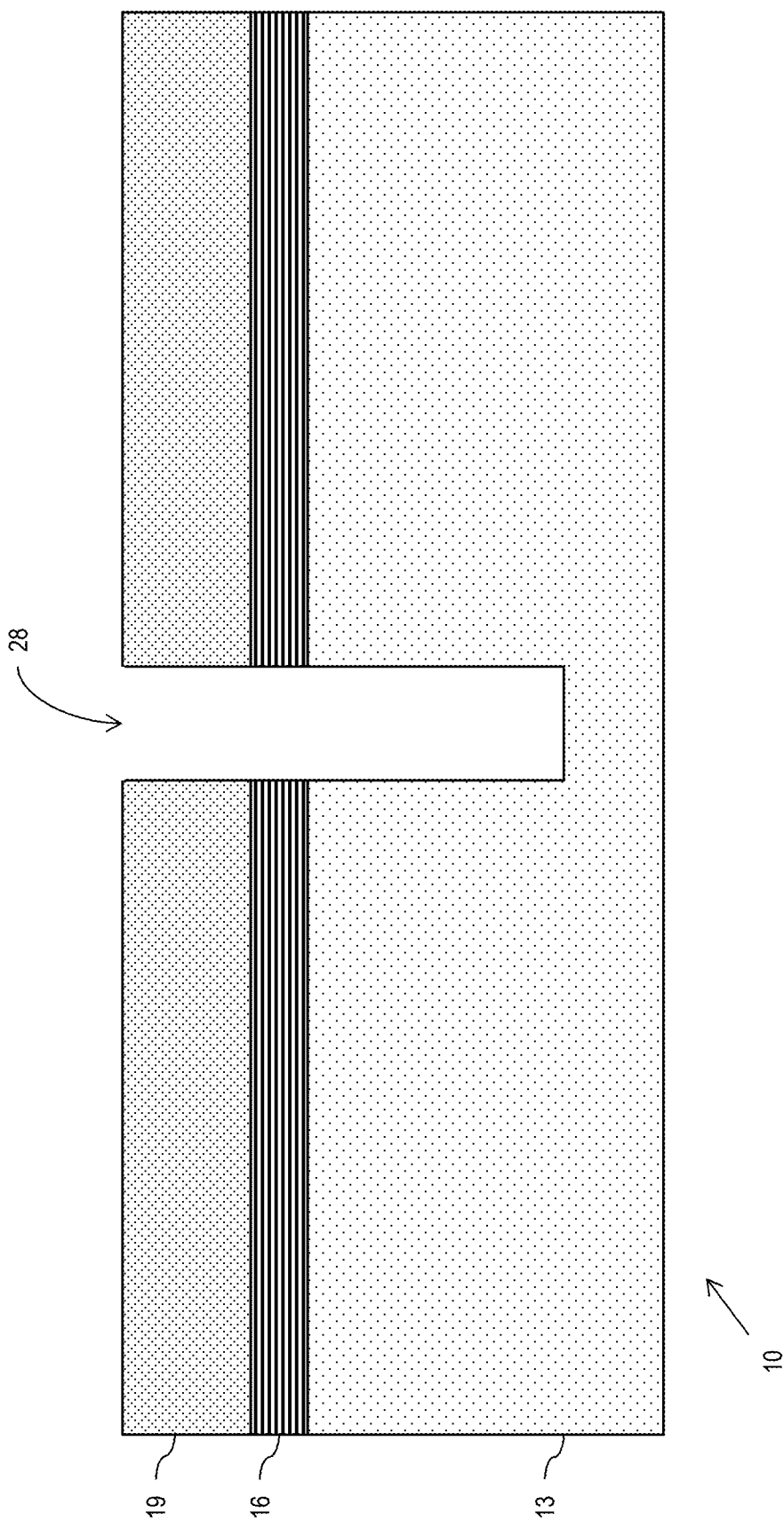

As shown in FIG. 12, a deep trench 28 is formed in the multi-layer substrate 10. The trench 28 passes through the dielectric layer 19, the metal layer 16, and at least partially into the silicon base layer 13. The trench 28 can be formed by any appropriate means, such as by applying a pattern and etching the various layer materials.

Figure 13:
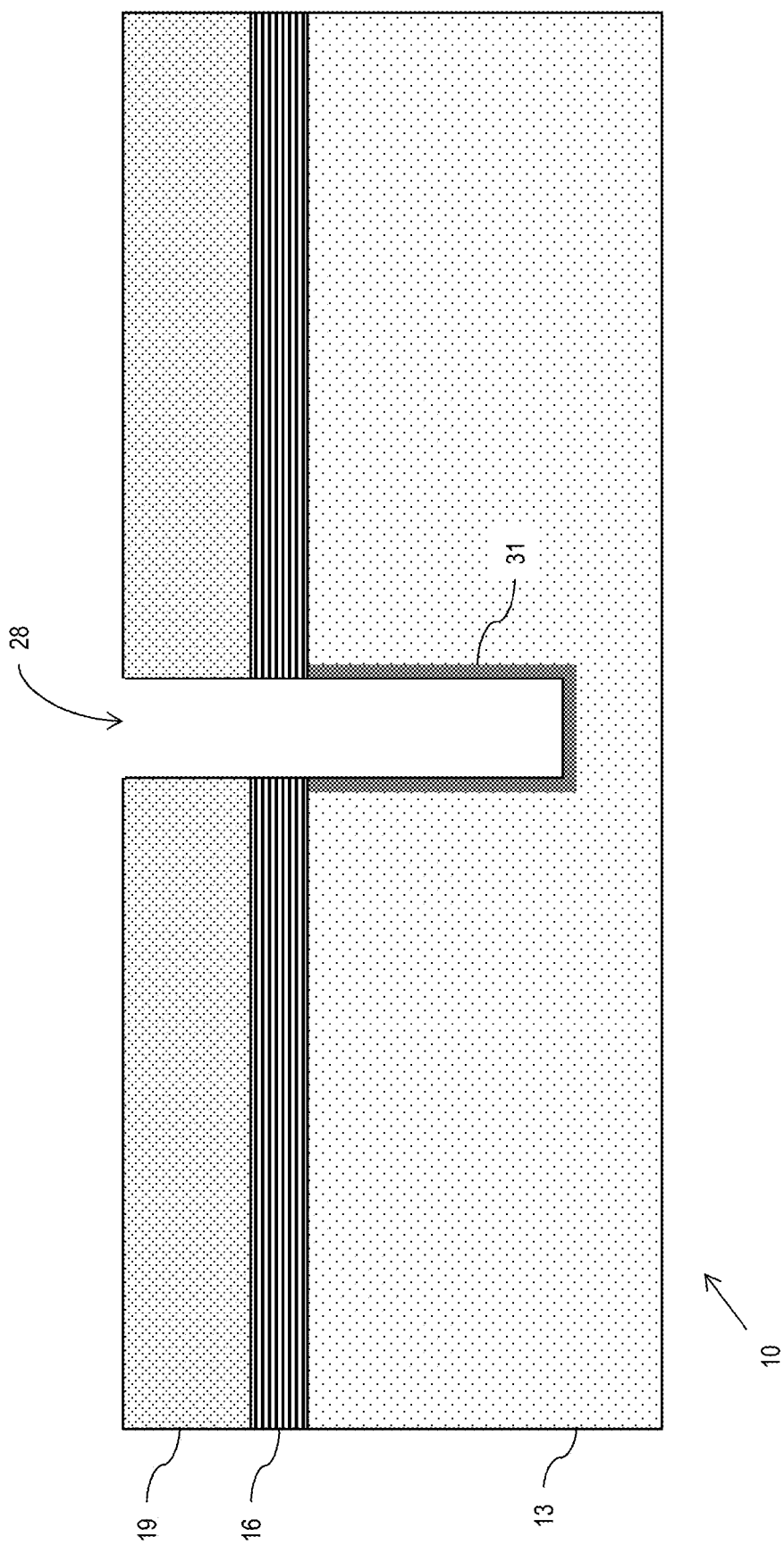

FIG. 13 shows a metal sidewall 31 formed in the trench 28. The metal sidewall 31 connects to the metal layer 16. In some embodiments, the metal sidewall 31 may connect only to the bottom surface of the metal layer 16. The metal sidewall 31 can be any appropriate conductive material, such as silicide. The metal layer 16 forms a first node of a capacitor structure.

Figure 14:
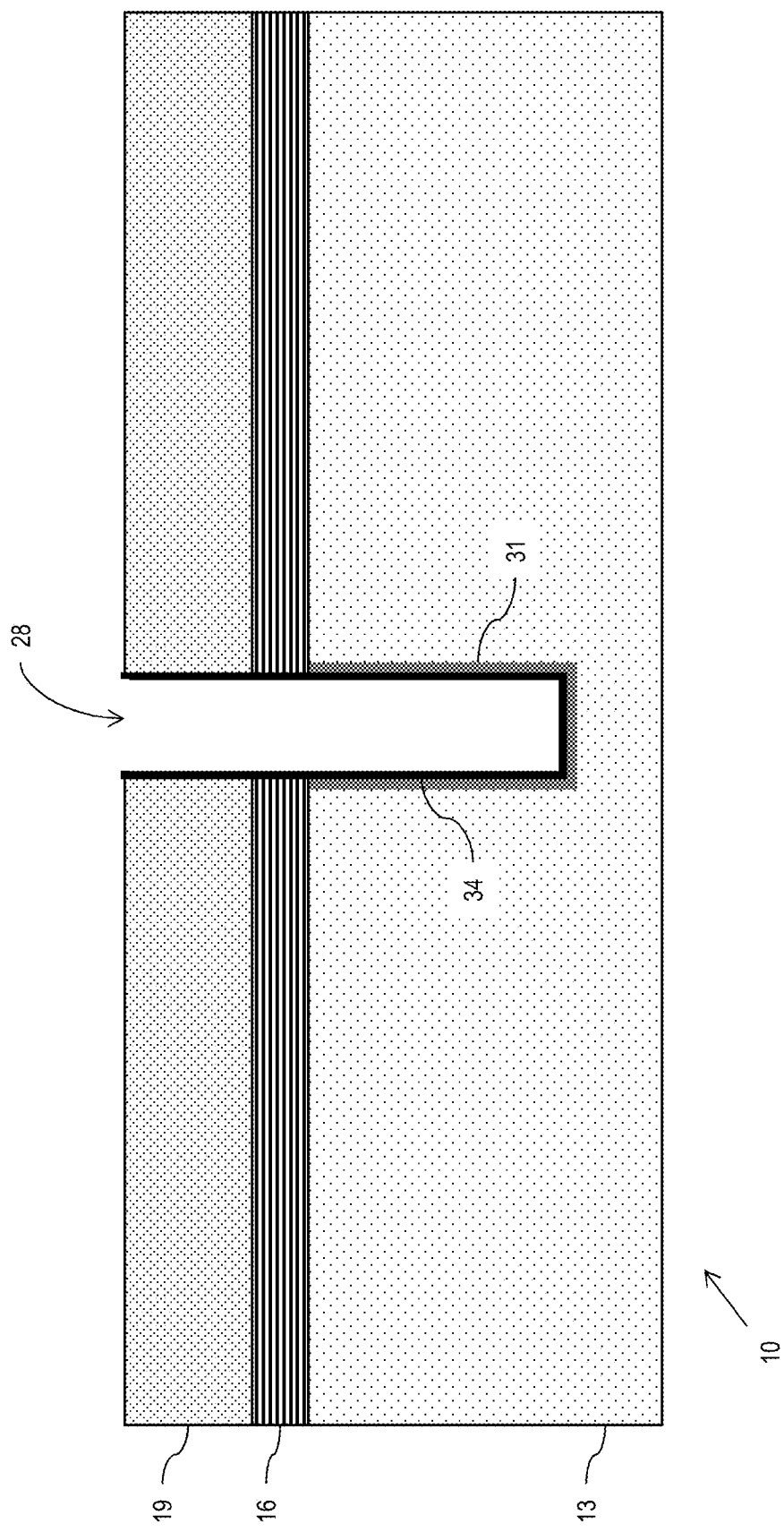

After the metal sidewall 31 is formed, a dielectric material 34 is deposited in the trench 28, as shown in FIG. 14.

Figure 15:
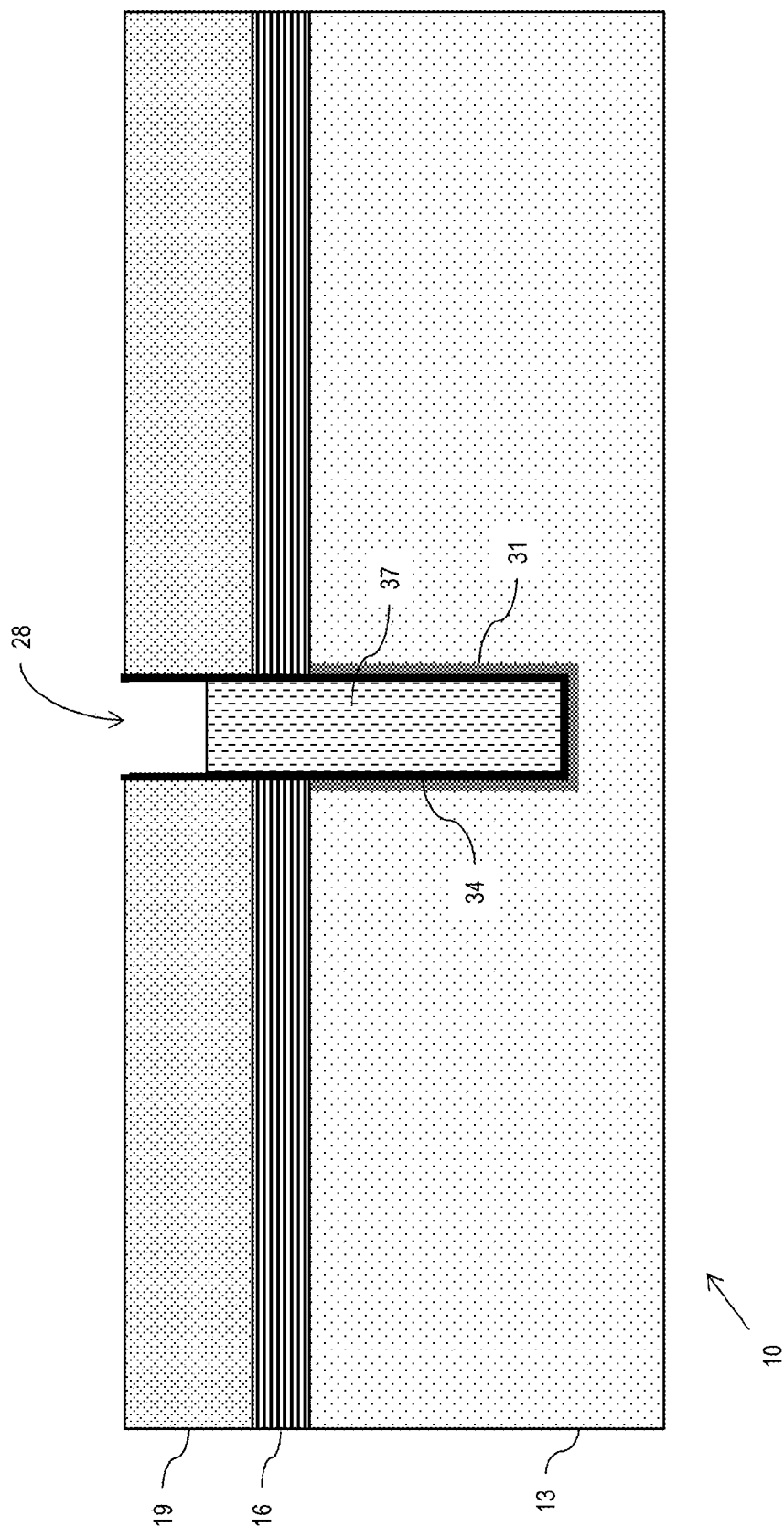

In FIG. 15, a conductor 37 is formed in the trench 28 by filling with a conductive fill material and recessing the conductor 37 to an appropriate height within the trench 28. Recessing of the conductive fill material can be accomplished by any appropriate means known in the art. The conductor 37 forms a second node of the capacitor structure.

Figure 16:
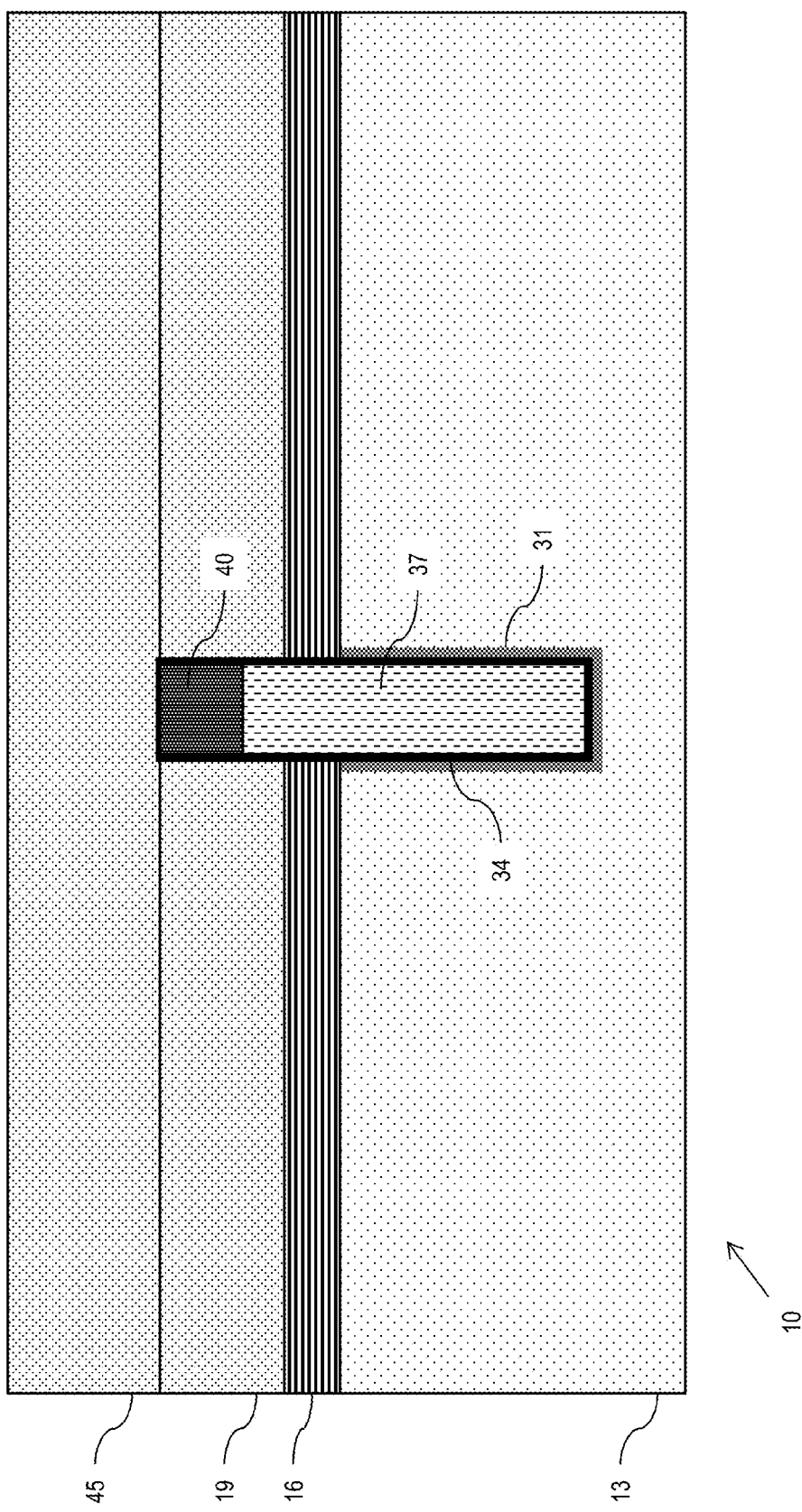

In FIG. 16, a poly cap 40 is deposited on the conductor 37, and another dielectric layer 45 is deposited onto the multi-layer substrate 10 on top of dielectric layer 19.

Figure 17:
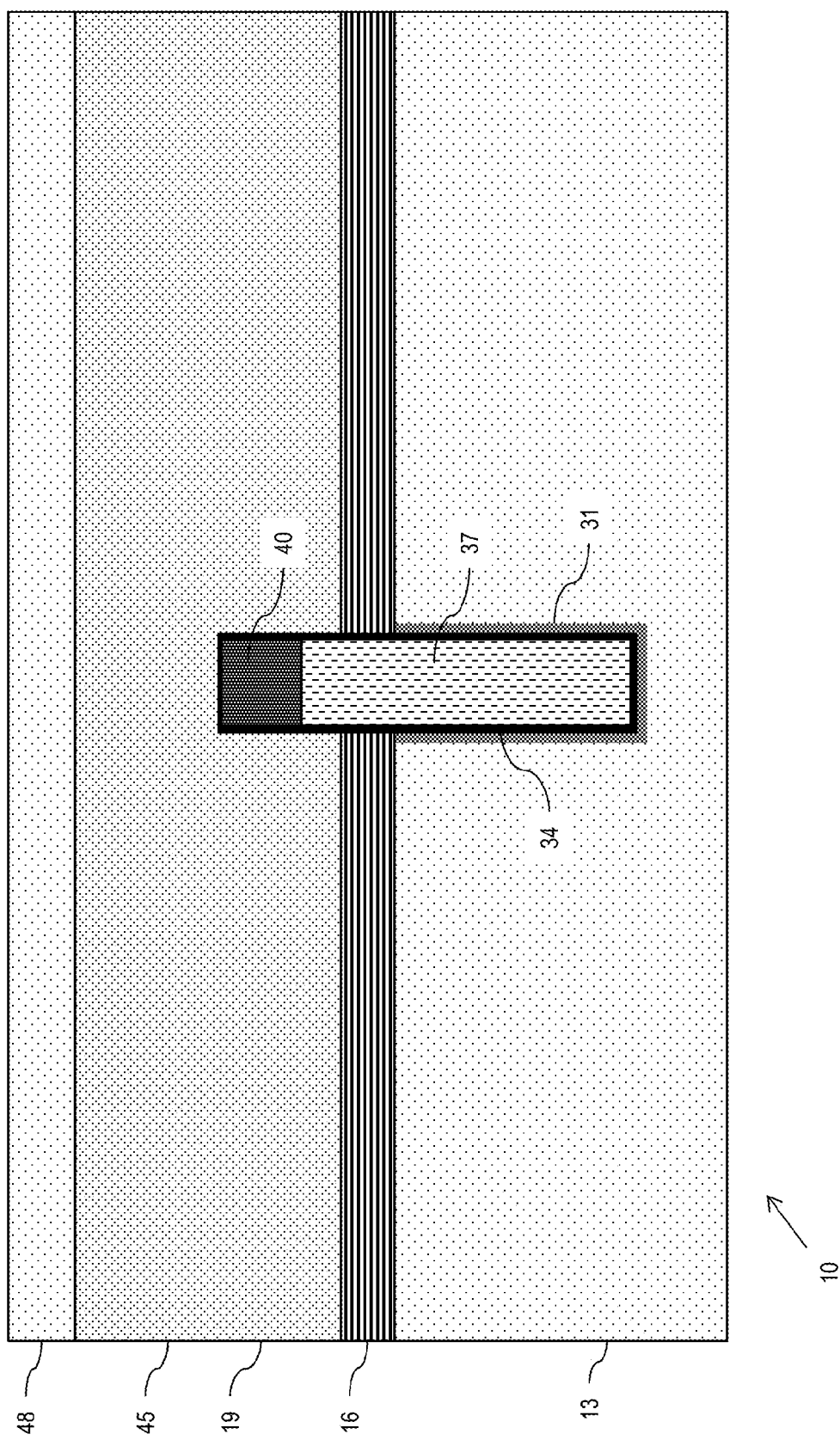

After dielectric layer 45 is deposited, a silicon layer 48 is bonded to the dielectric layer 45, as shown in FIG. 17. Processing of the multi-layer substrate 10 can proceed to STI patterning and etching, as is known in the art.

Figure 18:
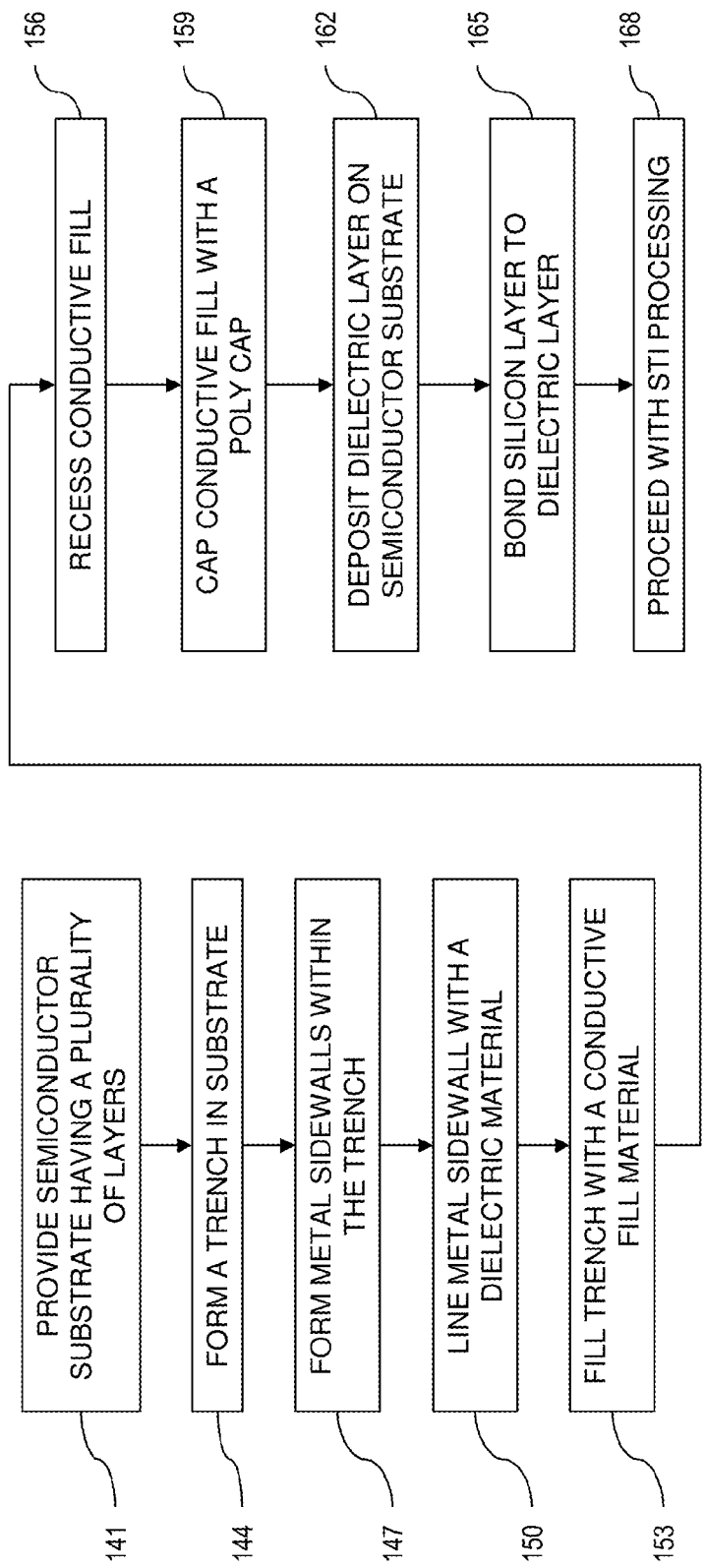
FIG. 18 is a flow diagram illustrating embodiments herein.

FIG. 18 shows a logic flowchart for an embodiment for a method of fabricating a capacitor in a semiconductor including providing a semiconductor substrate having a plurality of layers 141. A trench is formed in the wafer, at 144. At 147, sidewalls are formed within the trench such that the metal sidewall is in contact with the metal layer. The sidewalls may be a metal or silicide material. The metal sidewall is lined with a dielectric material, at 150. The trench is filled with a conductive fill material 153 such that the conductive fill material in the trench is not in contact with the metal layer and the conductive fill is recessed 156. At 159, the conductive fill is capped with a poly cap. At 162, an additional dielectric layer is deposited on the semiconductor substrate. A silicon layer is bonded to the dielectric layer, at 165. At 168, STI processing can proceed with etching as is known in the art.

Figure 19:
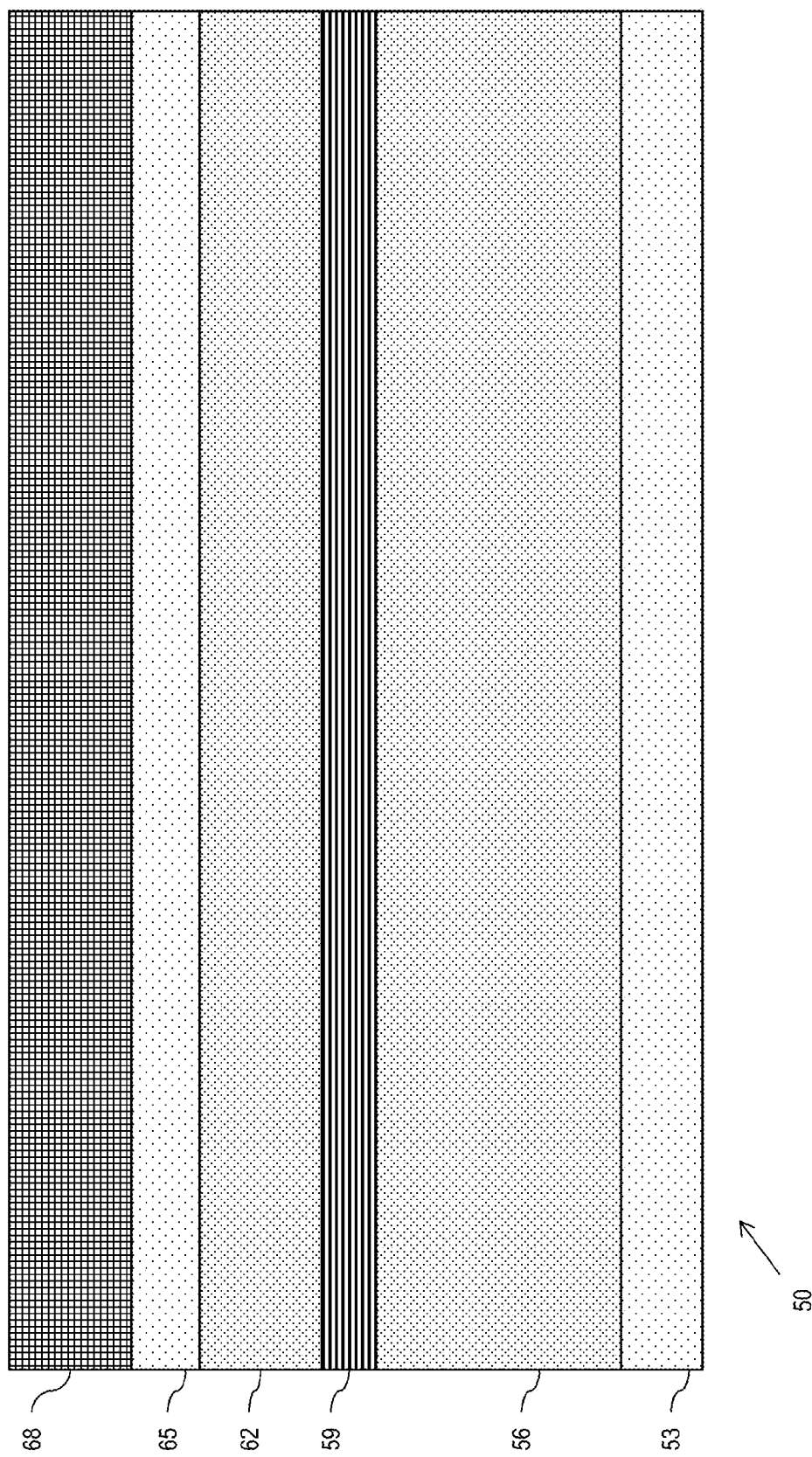
FIGS. 19-22 are schematic diagrams of a sectional view of semiconductor structure fabricating a capacitor according to embodiments herein.

FIGS. 19-22 show another embodiment of a deep trench MIM capacitor. FIG. 19 illustrates a schematic diagram of a sectional view of a multi-layer substrate 50 for fabricating a metal-insulator-metal capacitor with deep trench structure according to this embodiment. The multi-layer substrate 50 includes a silicon base layer 53, a first dielectric layer 56, a metal layer 59, a second dielectric layer 62, and an SOI layer 65. A sacrificial layer 68, such as an oxide layer, may cover the SOI layer 65.

Figure 20:
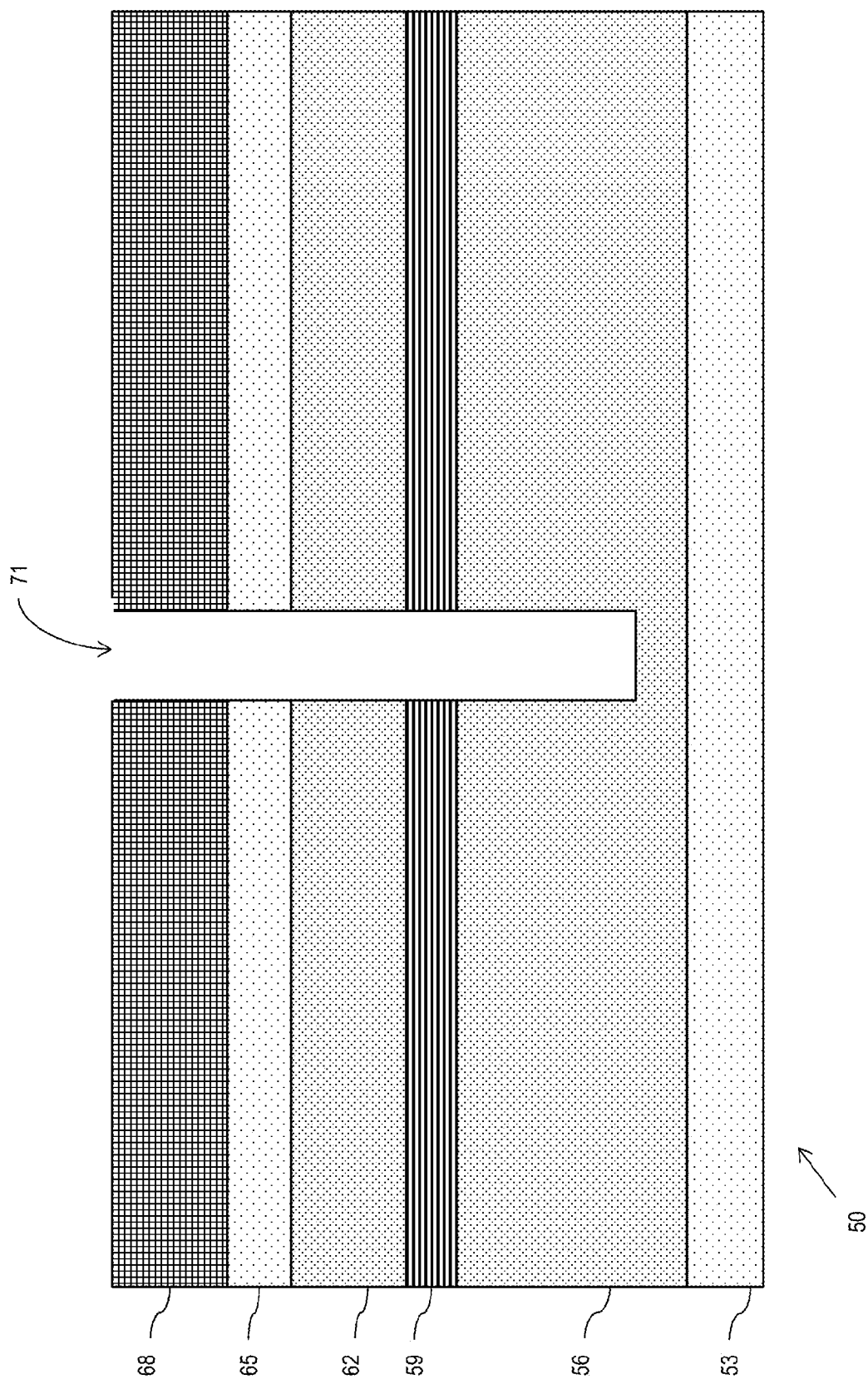

As shown in FIG. 20, a trench 71 is formed in the multi-layer substrate 50. The trench 71 passes through the sacrificial layer 68, the SOI layer 65, the second dielectric layer 62, the metal layer 59, and at least partially into the first dielectric layer 56. The trench 71 can be formed by any appropriate means, such as by applying a pattern and etching the various layer materials.

Figure 21:
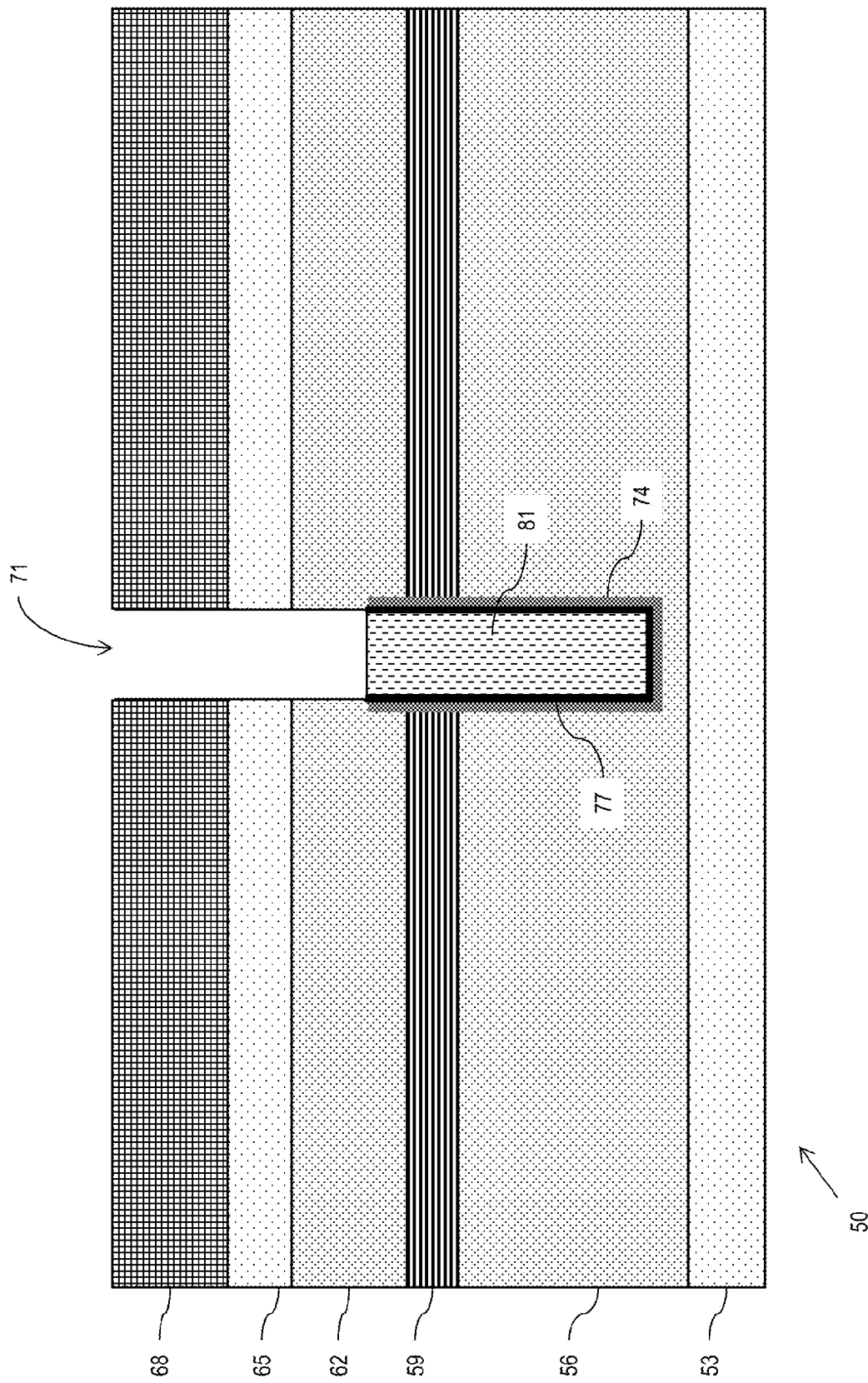

FIG. 21 shows a metal sidewall 74 formed in the trench 71. The metal sidewall 74 connects to the metal layer 59. The metal sidewall 74 can be any appropriate conductive material, such as silicide and may be the same material or different material as the metal layer 59. The metal layer 59 forms a first node of a capacitor structure. After the metal sidewall 74 is formed, a dielectric material 77 is deposited in the trench 71. A conductor 81 is formed in the trench 71 by filling with a conductive fill material and recessing the conductor 81 to an appropriate height within the trench 71. The dielectric material 77 separates the conductor 81 from the metal layer 59 and the metal sidewall 74 lining the trench 71. Recessing of the conductive fill material can be accomplished by any appropriate means known in the art. The conductive fill material may be the same material or different material as the metal layer 59 and the same as or different than the material used for the metal sidewall 74. The conductor 81 forms a second node of the capacitor structure.

Figure 22:
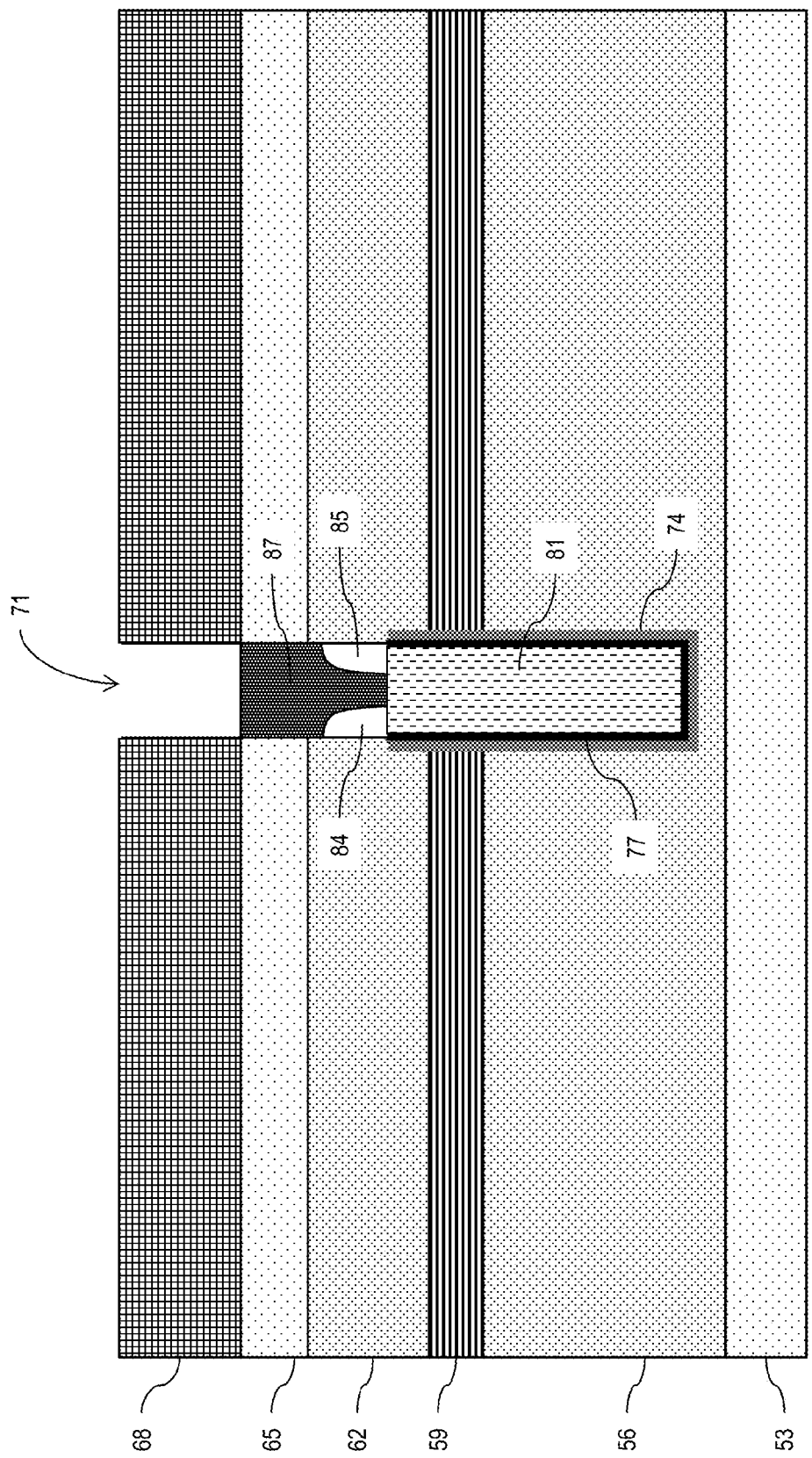

In FIG. 22, insulating spacers 84, 85 are formed on the conductor 81. Then the trench 71 is filled with poly forming a poly cap 87 and recessed to an appropriate level. Processing of the multi-layer substrate 50 can proceed to STI patterning and etching, as is known in the art.

Figure 23:
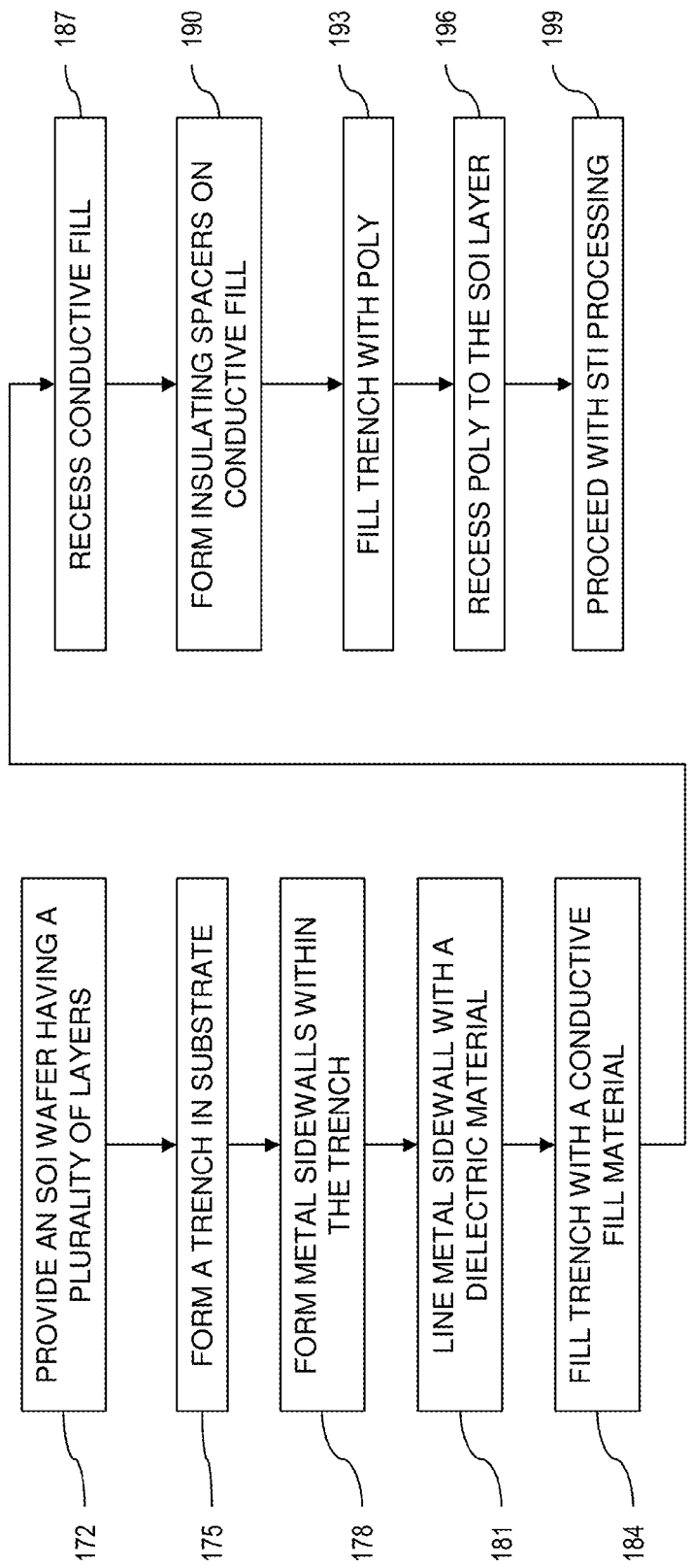
FIG. 23 is a flow diagram illustrating embodiments herein.

FIG. 23 shows a logic flowchart for an embodiment for a method of fabricating a capacitor in a semiconductor including providing a semiconductor substrate having a plurality of layers 172. A trench is formed in the wafer, at 175. At 178, sidewalls are formed within the trench such that the metal sidewall is in contact with the metal layer. The sidewalls may be a metal or silicide material. The metal sidewall is lined with a dielectric material, at 181. The trench is filled with a conductive fill material 184 such that the conductive fill material in the trench is not in contact with the metal layer and the conductive fill is recessed 187. At 190, insulating spacers are formed on the conductive fill. At 193, the trench is filled with poly and recessed to the SOI layer, at 196. At 199, STI processing can proceed with etching, as is known in the art.

Figure 24:
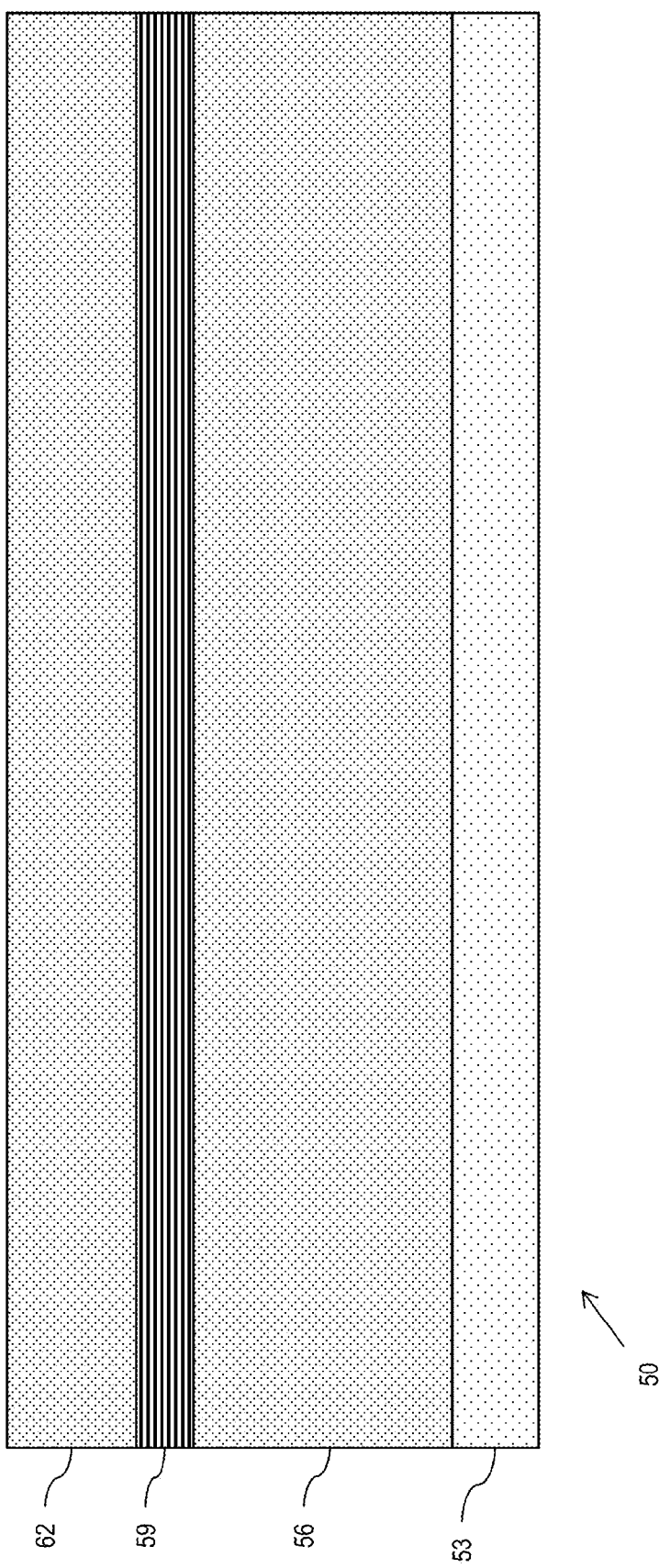
FIGS. 24-29 are schematic diagrams of a sectional view of semiconductor structure fabricating a capacitor according to embodiments herein.

FIGS. 24-29 show another embodiment of a deep trench MIM capacitor in which a silicon layer is bonded to an insulator layer after formation of the deep trench MIM capacitor. FIG. 24 illustrates a schematic diagram of a sectional view of a multi-layer substrate 50 for fabricating a metal-insulator-metal capacitor with deep trench structure according to this embodiment. The multi-layer substrate 50 includes a silicon base layer 53, a first dielectric layer 56, a metal layer 59, and a second dielectric layer 62.

Figure 25:
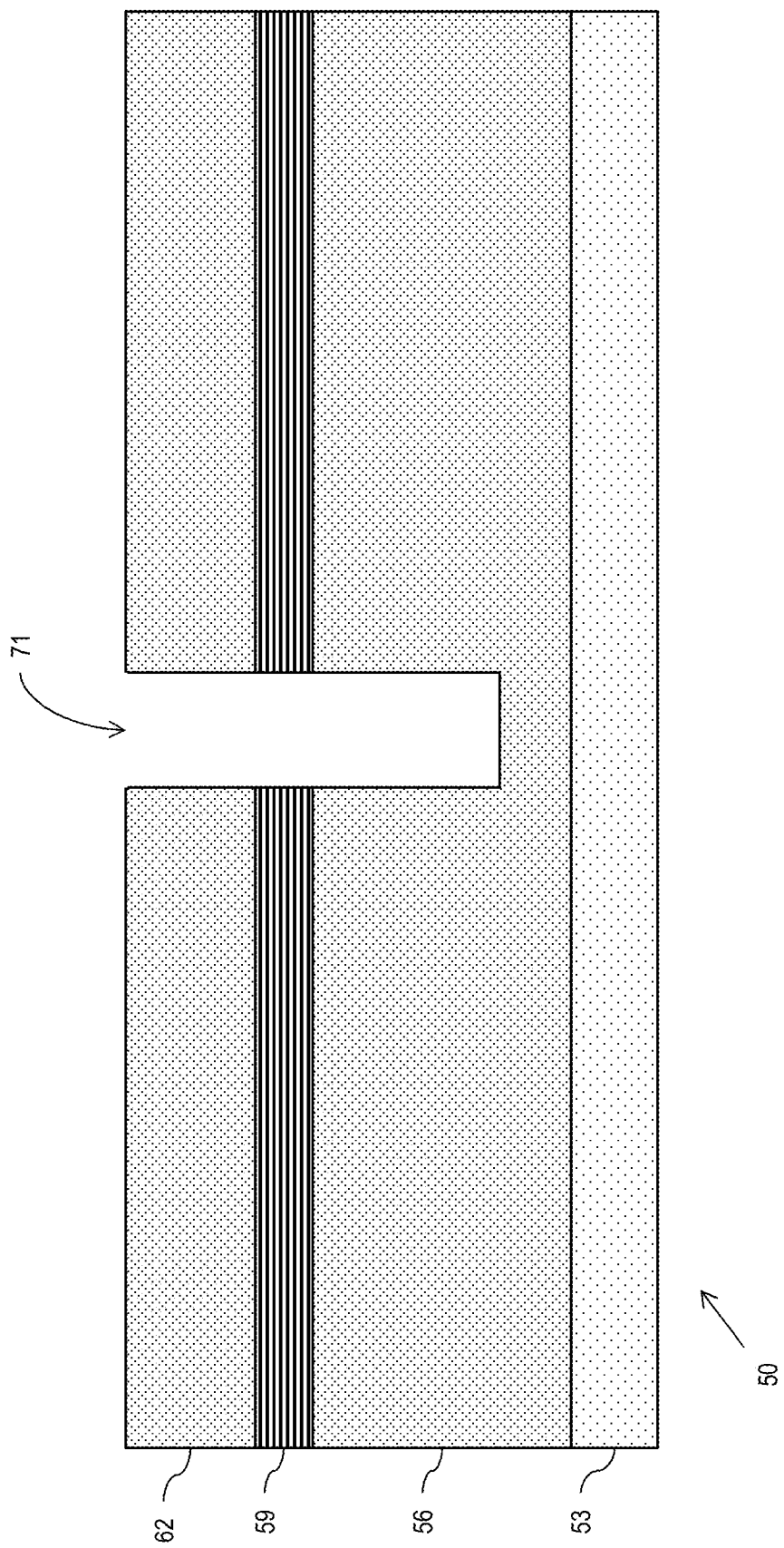

As shown in FIG. 25, a trench 71 is formed in the multi-layer substrate 50. The trench 71 passes through the second dielectric layer 62, the metal layer 59, and at least partially into the first dielectric layer 56. The trench 71 can be formed by any appropriate means, such as by applying a pattern and etching the various layer materials.

Figure 26:
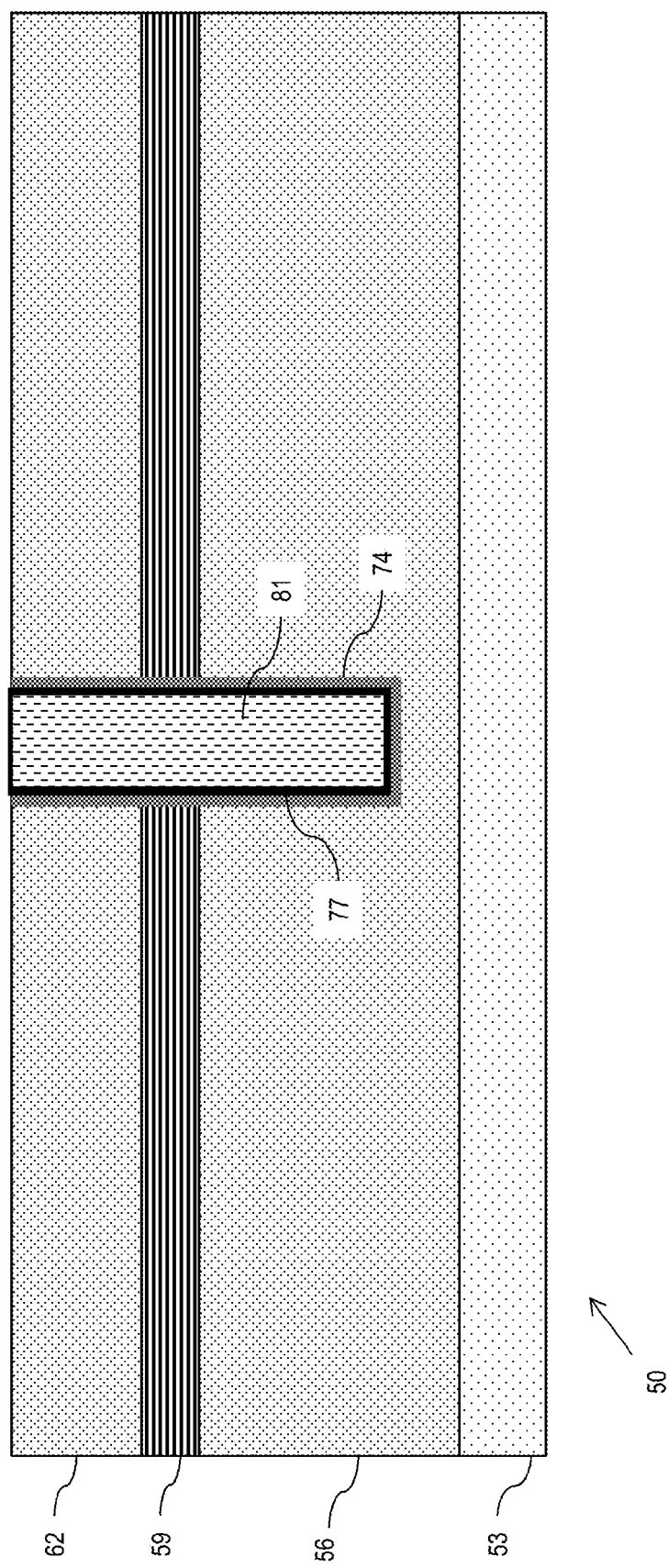

FIG. 26 shows a metal sidewall 74 formed in the trench 71. The metal sidewall 74 connects to the metal layer 59. The metal sidewall 74 can be any appropriate conductive material, such as silicide and may be the same material or different material as the metal layer 59. The metal layer 59 forms a first node of a capacitor structure. After the metal sidewall 74 is formed, a dielectric material 77 is deposited in the trench 71. A conductor 81 is formed in the trench 71 by filling with a conductive fill material. Any excess material is removed. The dielectric material 77 separates the conductor 81 from the metal layer 59 and the metal sidewall 74 lining the trench 71. The conductive fill material may be the same material or different material as the metal layer 59 and the same as or different than the material used for the metal sidewall 74. The conductor 81 forms a second node of the capacitor structure.

Figure 27:
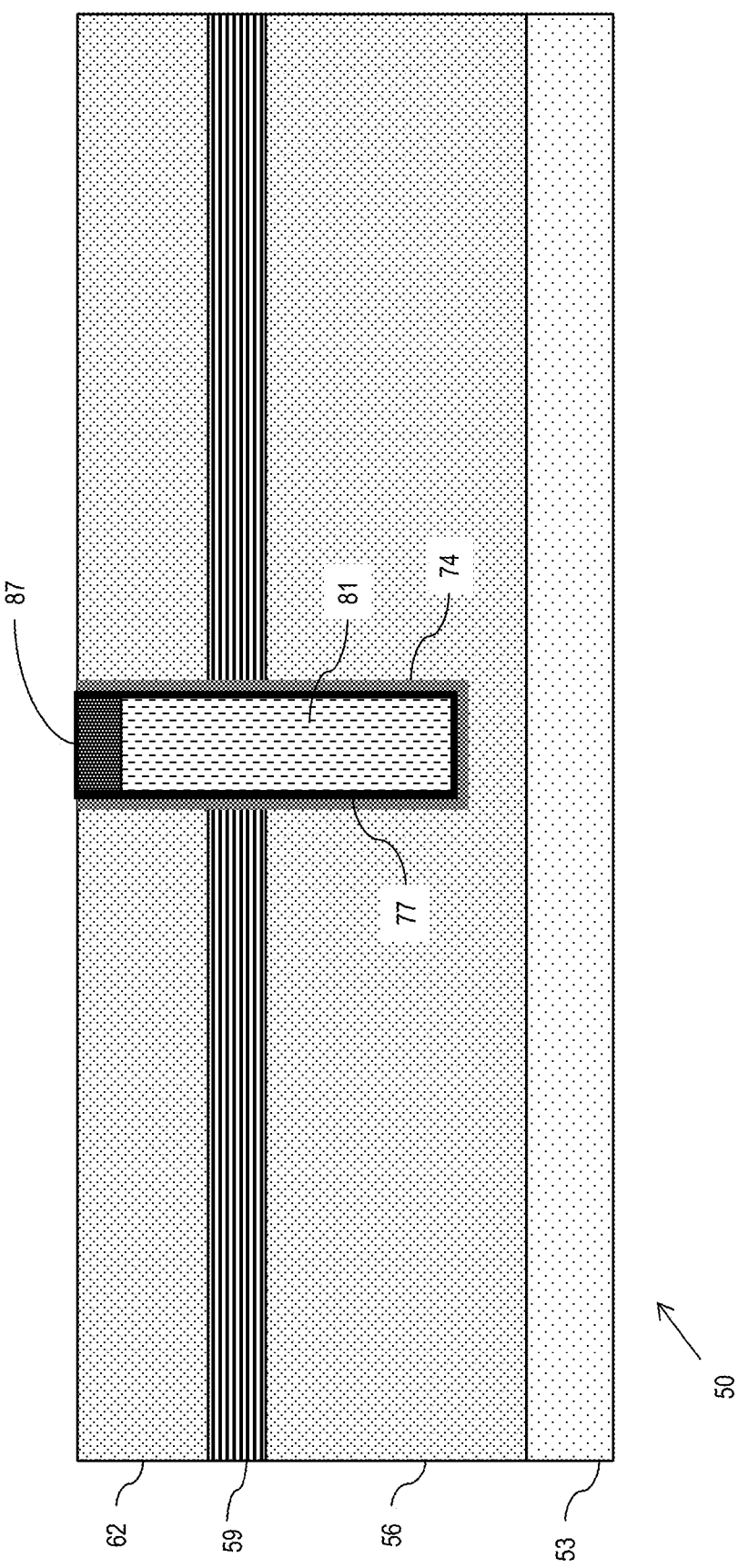

In FIG. 27, the conductor 81 is recessed and a poly cap 87 is deposited on the conductor 81. Any excess poly material is removed.

Figure 28:
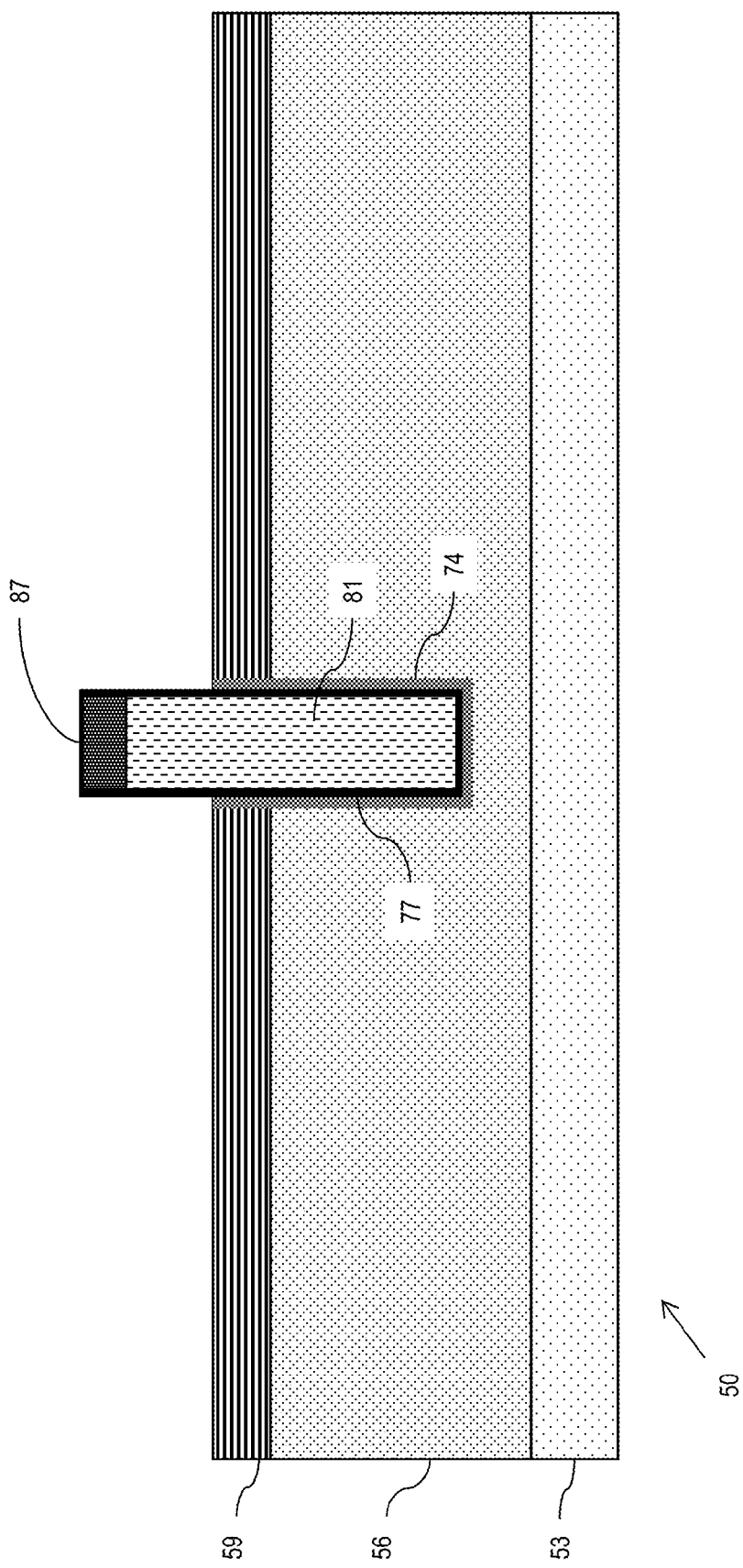

In FIG. 28, the second dielectric layer 62 is recessed. The portion of the metal sidewall 74 above the metal layer 59 is also recessed. Recessing of the materials can be accomplished by any appropriate means known in the art.

Figure 29:
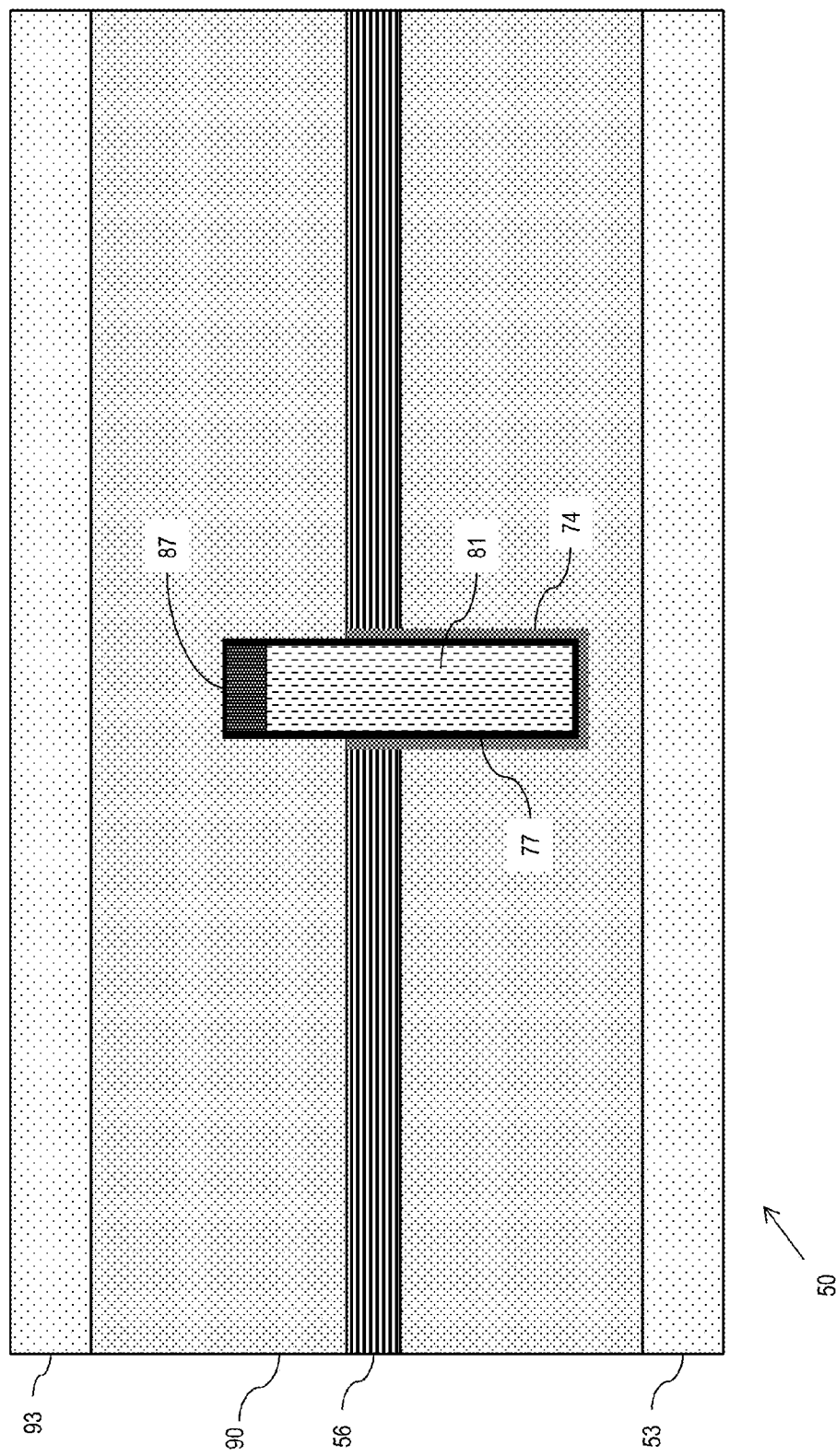

In FIG. 29, another dielectric layer 90 is deposited onto the multi-layer substrate 50 on top of the metal layer 59. After dielectric layer 90 is deposited, a silicon layer 93 is bonded to the dielectric layer 90. Processing of the multi-layer substrate 50 can proceed to STI patterning and etching, as is known in the art.

Figure 30:
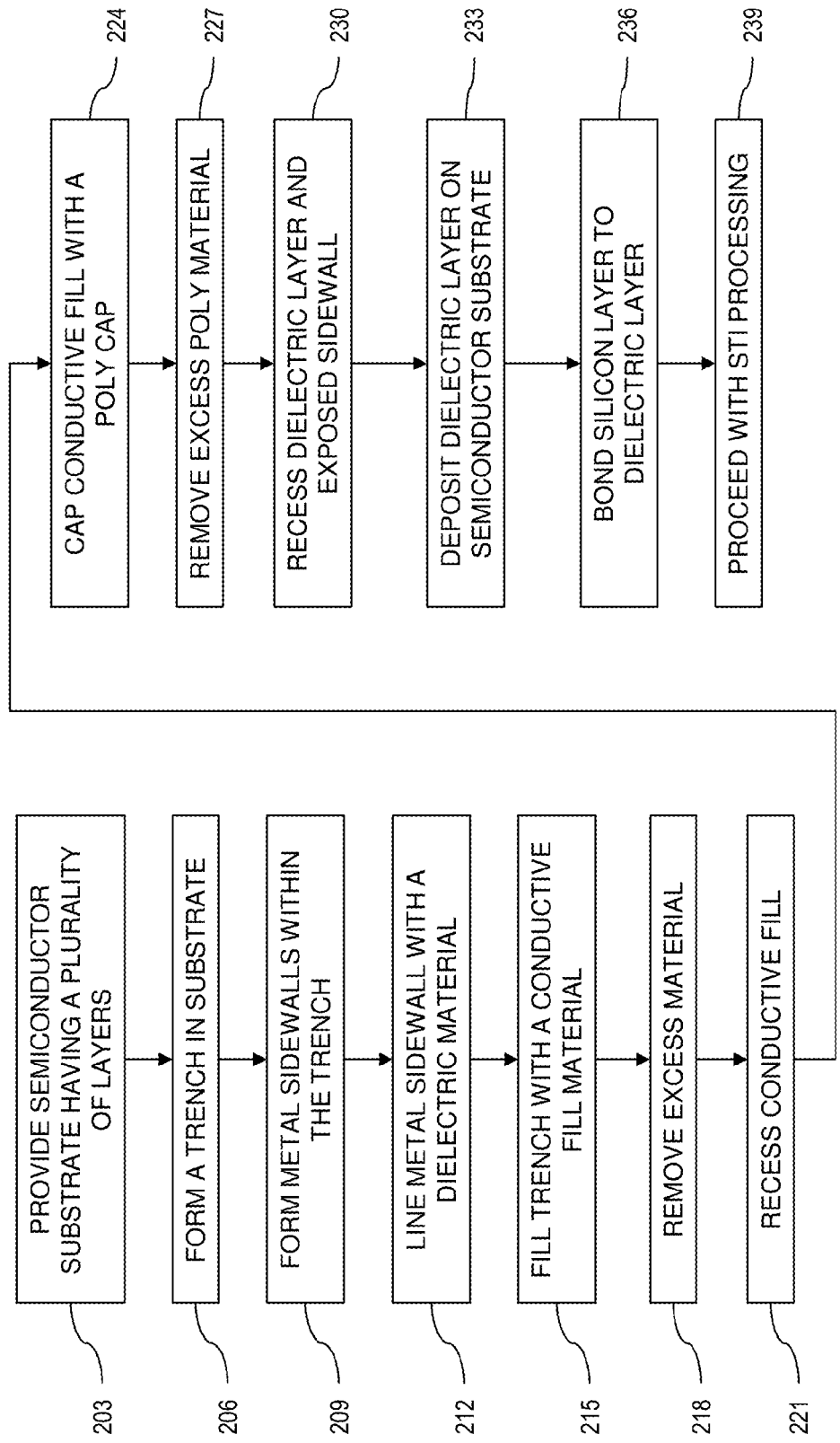
FIG. 30 is a flow diagram illustrating embodiments herein.

FIG. 30 shows a logic flowchart for an embodiment for a method of fabricating a capacitor in a semiconductor including providing a semiconductor substrate having a plurality of layers 203. A trench is formed in the wafer, at 206. At 209, sidewalls are formed within the trench such that the metal sidewall is in contact with the metal layer. The sidewalls may be a metal or silicide material. The metal sidewall is lined with a dielectric material, at 212. The trench is filled with a conductive fill material 215 such that the conductive fill material in the trench is not in contact with the metal layer. Excess material is removed, at 218. The conductive fill is recessed, at 221. At 224, the conductive fill is capped with a poly cap, and excess poly material is removed, at 227. At 230, the dielectric layer and exposed sidewall is recessed. At 233, an additional dielectric layer is deposited on the semiconductor substrate. A silicon layer is bonded to the dielectric layer, at 236. At 239, STI processing can proceed with etching, as is known in the art.

In Summary, according to one embodiment herein, a structure forming a metal-insulator-metal (MIM) trench capacitor is disclosed. The structure comprises a multi-layer substrate having a metal layer and at least one dielectric layer. A trench is etched into the substrate, passing through the metal layer. The trench is lined with a metal material that is in contact with the metal layer, which comprises a first node of a capacitor. A dielectric material lines the metal material in the trench. The trench is filled with a conductor. The dielectric material that lines the metal material separates the conductor from the metal layer and the metal material lining the trench. The conductor comprises a second node of the capacitor.

According to another embodiment herein, a semiconductor structure is disclosed. The structure comprises a wafer comprising an insulator layer, a metal layer below the insulator layer, and a substrate below the metal layer. A trench in the wafer extends through the insulator layer, through the metal layer, and at least partially into the substrate. A metal sidewall lines the trench such that the metal sidewall is in contact with the metal layer. The metal layer comprises a first node of a capacitor. A dielectric material lines the metal sidewall. A conductive fill material fills the trench such that the conductive fill material is not in contact with the metal layer. The conductive fill material comprises a second node of the capacitor.

According to another embodiment herein, a method of forming a capacitor structure is disclosed. The method comprises forming a multi-layer semiconductor substrate comprising a metal layer and at least one other layer. Forming a trench in the multi-layer substrate. Forming a metal sidewall within the trench such that the metal sidewall is in contact with the metal layer. The metal layer is a first node of the capacitor structure. Lining the metal sidewall with a dielectric material. Filling the trench with a conductive fill material such that the conductive fill material in the trench is not in contact with the metal layer. The conductive fill material is a second node of the capacitor structure.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a capacitor structure, said method comprising:
   forming a substrate comprising:
      a metal layer; and
      at least one other layer;
   forming a trench in said substrate;
   forming a metal sidewall within said trench such that said metal sidewall is in contact with said metal layer, said metal layer comprising a first node of said capacitor structure;
   lining said metal sidewall with a dielectric material; and
   filling said trench with a conductive fill material such that said conductive fill material in said trench is not in contact with said metal layer, said conductive fill material comprising a second node of said capacitor structure,
   said substrate comprising a dielectric layer above said metal layer, said method further comprising:
   after said filling said trench with conductive fill material, recessing said conductive fill material in said trench;
   capping said conductive fill material;
   recessing said dielectric layer and said metal sidewall above said metal layer; and
   depositing another dielectric layer on said metal layer over said conductive fill material and said cap.

2. The method of claim 1, said forming a substrate further comprising:
   providing a first silicon layer;
   depositing said metal layer on said first silicon layer; and
   depositing a dielectric layer on said metal layer.

3. The method of claim 2, said forming a substrate further comprising:
   bonding a Silicon-on-insulator (SOI) layer on said dielectric layer.

4. The method of claim 3, further comprising:
   after said filling said trench with conductive fill material, recessing said conductive fill material in said trench so as to expose at least an upper section of said trench;
   removing said metal sidewall from said upper section of said trench;
   depositing additional conductive fill material such that said conductive fill material is in contact with said SOI layer; and
   capping said conductive fill material.

5. The method of claim 1, said substrate further comprising at least one of:
   a silicon layer;
   a semiconductor;
   and
   a conductor layer.

6. The method of claim 1, further comprising:
   after said filling said trench with conductive fill material, recessing said conductive fill material in said trench so as to expose at least an upper section of said trench; and
   capping said conductive fill material.

7. The method of claim 1, further comprising forming a first contact to said metal layer and a second contact to said conductive fill material.

8. The method of claim 1, further comprising:
   bonding a Silicon-on-insulator layer on said another dielectric layer.

9. A method of forming a capacitor structure, said method comprising:
   forming a substrate comprising:
      a metal layer; and
      at least one other layer;
   forming a trench in said substrate;
   forming a metal sidewall within said trench such that said metal sidewall is in contact with said metal layer, said metal layer comprising a first node of said capacitor structure;
   lining said metal sidewall with a dielectric material; and
   filling said trench with a conductive fill material such that said conductive fill material in said trench is not in contact with said metal layer, said conductive fill material comprising a second node of said capacitor structure,
   said substrate comprising a dielectric layer above said metal layer, said method further comprising:
   after said filling said trench with conductive fill material, recessing said conductive fill material in said trench;
   capping said conductive fill material;
   recessing said dielectric layer and said metal sidewall above said metal layer;
   depositing another dielectric layer on said metal layer over said conductive fill material and said cap; and
   bonding a Silicon-on-insulator layer (SOI) on said another dielectric layer.

10. The method of claim 9, said forming a substrate further comprising:
    providing a first silicon layer;
    depositing said metal layer on said first silicon layer; and
    depositing said dielectric layer on said metal layer.

11. The method of claim 9, said substrate further comprising at least one of:
    a silicon layer;
    a semiconductor;
    and
    a conductor layer.

12. The method of claim 9, said recessing said conductive fill material in said trench further comprising:
    expose exposing at least an upper section of said trench.

13. The method of claim 9, further comprising forming a first contact to said metal layer and a second contact to said conductive fill material.

14. A method comprising:
    forming a substrate comprising:
       providing a first silicon layer,
       depositing a metal layer on said first silicon layer,
       depositing a dielectric layer on said metal layer, and
       bonding a Silicon-on-insulator (SOI) layer on said dielectric layer;
    forming a trench in said substrate through said metal layer, said dielectric layer, and said SOI layer;
    forming a metal sidewall within said trench such that said metal sidewall is in contact with said metal layer, said metal layer comprising a first node of a capacitor structure;
    lining said metal sidewall with a dielectric material;
    filling said trench with a conductive fill material such that said conductive fill material in said trench is not in contact with said metal layer, said conductive fill material comprising a second node of said capacitor structure;
    after said filling said trench with conductive fill material, recessing said conductive fill material in said trench so as to expose at least an upper section of said trench;
    removing said metal sidewall from said upper section of said trench;
    depositing additional conductive fill material such that said conductive fill material is in contact with said SOI layer; and
    capping said conductive fill material.

* * * * *